US012633491B2

(12) United States Patent
Morishita et al.

(10) Patent No.: US 12,633,491 B2
(45) Date of Patent: May 19, 2026

(54) METHOD OF ADJUSTING CHARGED PARTICLE OPTICAL SYSTEM AND CHARGED PARTICLE BEAM APPARATUS

(71) Applicant: JEOL Ltd., Tokyo (JP)

(72) Inventors: Shigeyuki Morishita, Tokyo (JP); Yuji Kohno, Tokyo (JP)

(73) Assignee: JEOL Ltd., Tokyo (JP)

( * ) Notice: Subject to any disclaimer, the term of this patent is extended or adjusted under 35 U.S.C. 154(b) by 340 days.

(21) Appl. No.: 18/385,115

(22) Filed: Oct. 30, 2023

(65) Prior Publication Data

US 2024/0145211 A1 May 2, 2024

(30) Foreign Application Priority Data

Oct. 31, 2022 (JP) ................................ 2022-174717

(51) Int. Cl.
*H01J 37/153* (2006.01)
*H01J 37/21* (2006.01)
*H01J 37/28* (2006.01)

(52) U.S. Cl.
CPC ............ *H01J 37/153* (2013.01); *H01J 37/21* (2013.01); *H01J 37/28* (2013.01); *H01J 2237/1516* (2013.01); *H01J 2237/1534* (2013.01)

(58) Field of Classification Search
CPC .......... H01J 37/153; H01J 37/21; H01J 37/28; H01J 2237/1516; H01J 2237/1534
See application file for complete search history.

(56) References Cited

U.S. PATENT DOCUMENTS 6,555,818 B1 * 4/2003 Hosokawa .............. H01J 37/26 250/311
6,930,312 B2 * 8/2005 Matsuya ............... H01J 37/153 250/398
8,129,680 B2 * 3/2012 Hirose .................... H01J 37/28 250/307
2002/0100873 A1 * 8/2002 Ohkura .................. G01N 23/04 250/311

(Continued)

FOREIGN PATENT DOCUMENTS

DE 112014006444 T5 * 11/2016 .............. H01J 37/26
EP 2639814 B1 * 6/2017 ............ H01J 37/244

(Continued)

OTHER PUBLICATIONS

Office Action issued in JP2022174717 on Oct. 8, 2024.

(Continued)

*Primary Examiner* — David A Vanore
(74) *Attorney, Agent, or Firm* — The Webb Law Firm

(57) ABSTRACT

A method of adjusting a charged particle optical system in a charged particle beam apparatus provided with the charged particle optical system including an aberration corrector in which multipole elements disposed in three or more stages and transfer optical systems are alternately disposed. The method includes adjusting aberration using at least two of the multipole elements without using at least one of the multipole elements, and adjusting parameters of the charged particle optical system other than aberration using at least one of the transfer optical systems that is not disposed between the at least two of the multipole elements used.

11 Claims, 15 Drawing Sheets

(56) References Cited

U.S. PATENT DOCUMENTS

2004/0036030 A1* 2/2004 Matsuya ............... H01J 37/153 250/396 R
2004/0227099 A1* 11/2004 Matsuya ............... H01J 37/153 250/398
2007/0181806 A1* 8/2007 Nakano ................. H01J 37/153 250/310
2009/0032709 A1* 2/2009 Sawada ................... H01J 37/26 250/311
2011/0284758 A1* 11/2011 Sawada ................. H01J 37/153 250/396 ML
2012/0119107 A1* 5/2012 Sawada ............... H01J 37/1471 250/396 ML
2015/0029593 A1* 1/2015 Sawada .................. G01N 23/20 359/637
2015/0248944 A1* 9/2015 Cheng ................... H01J 37/153 250/398
2015/0332889 A1* 11/2015 Sawada ................... H01J 37/06 250/311
2017/0025248 A1* 1/2017 Shibata ................. H01J 37/226
2017/0236681 A1* 8/2017 Morishita ........... H01J 37/1471 250/396 ML
2017/0236684 A1* 8/2017 Kohno .................... H01J 37/22 250/311
2017/0365442 A1* 12/2017 Morishita ............... H01J 37/28
2018/0366295 A1* 12/2018 Morishita ............... H01J 37/28
2019/0066968 A1* 2/2019 Kohno .................. H01J 37/222
2019/0272971 A1* 9/2019 Morishita ............. H01J 37/222
2019/0304739 A1* 10/2019 Morishita ............... H01J 37/10
2022/0415605 A1* 12/2022 Hayashi .................. H01J 37/28
2023/0268155 A1* 8/2023 Morishita ............... H01J 37/28 250/311
2024/0047170 A1* 2/2024 Mohammadi-Gheidari ................ H01J 37/153

FOREIGN PATENT DOCUMENTS

EP 3255649 A1 * 12/2017 ............ H01J 37/153
EP 4322198 A2 * 2/2024 .............. H01J 37/28
EP 4362056 A1 * 5/2024 ............ H01J 37/153
JP 200392078 A 3/2003
JP 200954565 A 3/2009
JP 5028181 B2 * 9/2012 .............. H01J 37/26
JP 2017220413 A 12/2017
JP 2019179650 A 10/2019

OTHER PUBLICATIONS

Extended European Search Report issued in EP23196656.5 on Feb. 26, 2024.

McAuliffe et al., 4D-STEM elastic stress state characterisation of a TWIP steel nanotwin, Arxiv.org, Cornell University Library, Apr. 8, 2020, XP081790358, pp. 1-5.

McAuliffe et al., 4D-STEM elastic stress state characterisation of a TWIP steel nanotwin, Arxiv.org, Cornell University Library, Apr. 8, 2020, XP081640263, pp. 1-6.

* cited by examiner

METHOD OF ADJUSTING CHARGED PARTICLE OPTICAL SYSTEM AND CHARGED PARTICLE BEAM APPARATUS

CROSS REFERENCE TO RELATED APPLICATION

This application claims priority to Japanese Patent Application No. 2022-174717, filed on Oct. 31, 2022, the disclosure of which is hereby incorporated by reference in its entirety.

BACKGROUND OF THE INVENTION

Field of the Invention

The present invention relates to a method of adjusting a charged particle optical system and a charged particle beam apparatus.

Description of Related Art

In electron microscopes such as transmission electron microscopes and scanning electron microscopes, aberration correction is an important technique for acquiring a high-resolution image.

For example, JP-A-2003-92078 discloses a two-stage hexapole field type spherical aberration corrector in which hexapole elements are disposed in two stages. In the two-stage hexapole field type spherical aberration corrector, a positive spherical aberration of an objective lens is corrected with a negative spherical aberration caused by the hexapole element.

Further, JP-A-2009-054565 discloses a three-stage hexapole field type spherical aberration corrector in which hexapole elements are disposed in three stages. The three-stage hexapole field type spherical aberration corrector can correct a six-fold astigmatism that cannot be corrected by the two-stage hexapole field type spherical aberration corrector.

Further, JP-A-2019-179650 discloses a four-stage hexapole field type spherical aberration corrector in which hexapole elements are disposed in four stages. The four-stage hexapole field type spherical aberration corrector can correct a sixth-order three-lobe aberration that cannot be corrected by the three-stage hexapole field type spherical aberration corrector.

In an electron microscope, parameters of an electron optical system are changed according to methods to be employed.

For example, a differential phase contrast method (hereinafter also referred to as DPC method) is known as a method of visualizing an electromagnetic field of a sample using a scanning transmission electron microscope. In the DPC method, an amount of electron beam deflection caused due to the electromagnetic field in the sample is measured to visualize the electromagnetic field. In the DPC method, parameters other than aberration, such as a convergence angle of an electron beam and a crossover position, have to be adjusted.

However, if a lens is added to the electron optical system to adjust parameters other than the aberration, the size of the apparatus increases.

SUMMARY OF THE INVENTION

According to a first aspect of the present disclosure, there is provided a method of adjusting a charged particle optical system in a charged particle beam apparatus provided with the charged particle optical system including an aberration corrector in which multipole elements disposed in three or more stages and transfer optical systems are alternately disposed, the method including:

adjusting aberration using at least two of the multipole elements without using at least one of the multipole elements; and adjusting parameters of the charged particle optical system other than aberration using at least one of the transfer optical systems that is not disposed between the at least two of the multipole elements used.

According to a second aspect of the present disclosure, there is provided a charged particle beam apparatus including a charged particle optical system including an aberration corrector in which multipole elements disposed in three or more stages and transfer optical systems are alternately disposed, wherein the charged particle beam apparatus has a first mode in which aberration is adjusted using all of the multipole elements of the aberration corrector, and a second mode in which aberration is adjusted using at least two of the multipole elements without using at least one of the multipole elements, and parameters of the charged particle optical system other than aberration are adjusted using at least one of the transfer optical systems that is not disposed between the at least two of the multipole elements used.

DESCRIPTION OF THE INVENTION

Figure 1:
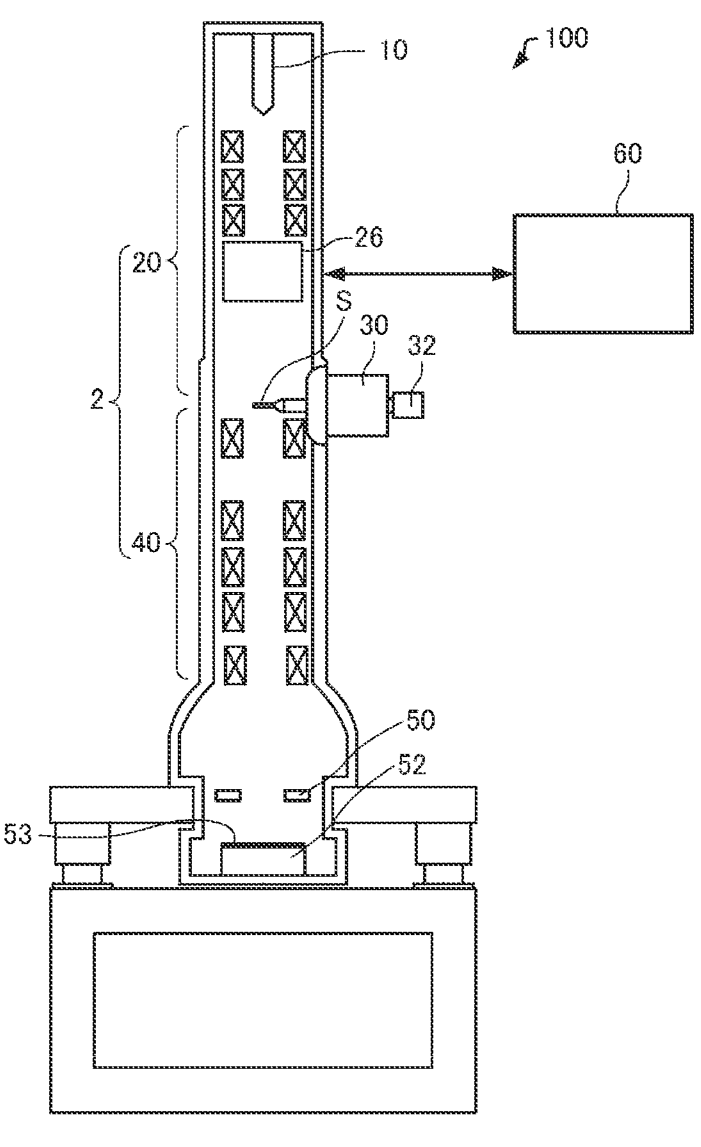
FIG. 1 is a diagram illustrating a configuration of an electron microscope according to the first embodiment.

According to an embodiment of the present disclosure, there is provided a method of adjusting a charged particle optical system in a charged particle beam apparatus provided with the charged particle optical system including an aberration corrector in which multipole elements disposed in three or more stages and transfer optical systems are alternately disposed, the method including:

adjusting aberration using at least two of the multipole elements without using at least one of the multipole elements; and adjusting parameters of the charged particle optical system other than aberration using at least one of the transfer optical systems that is not disposed between the at least two of the multipole elements used.

In such a method of adjusting a charged particle optical system, parameters other than aberration can be adjusted using an aberration corrector. For this reason, in such a method of adjusting a charged particle optical system, the degree of freedom in adjusting the charged particle optical system can be improved without increasing the size of the apparatus.

According to an embodiment of the present disclosure, there is provided a charged particle beam apparatus including a charged particle optical system including an aberration corrector in which multipole elements disposed in three or more stages and transfer optical systems are alternately disposed, wherein the charged particle beam apparatus has a first mode in which aberration is adjusted using all of the multipole elements of the aberration corrector, and a second mode in which aberration is adjusted using at least two of the multipole elements without using at least one of the multipole elements, and parameters of the charged particle optical system other than aberration are adjusted using at least one of the transfer optical systems that is not disposed between the at least two of the multipole elements used.

In such a charged particle beam apparatus, parameters other than aberration can be adjusted using an aberration corrector. For this reason, in such a charged particle beam apparatus, the degree of freedom in adjusting the charged particle optical system can be improved without increasing the size of the apparatus.

Preferred embodiments of the invention will now be described in detail with reference to the drawings. It is noted that the following embodiments described below do not unduly limit the scope of the invention as stated in the claims. Further, all of the components described in the following embodiments are not necessarily essential requirements of the invention.

Furthermore, although an electron microscope that irradiates a sample with an electron beam will be described below as an example of the charged particle beam apparatus according to the present invention, the charged particle beam apparatus according to the present invention may be an apparatus that irradiates a sample with a charged particle beam other than an electron beam (an ion beam or the like).

1. First Embodiment

1.1. Electron Microscope

First, an electron microscope according to the first embodiment will be described with reference to the drawings. FIG. 1 is a diagram illustrating a configuration of an electron microscope 100 according to the first embodiment.

As illustrated in FIG. 1, the electron microscope 100 includes an electron source 10, an electron optical system 2 including an irradiation optical system 20 and an imaging optical system 40, a sample stage 30, an STEM detector 50, a segmented detector 52, and a control unit 60. The electron microscope 100 is a scanning transmission electron microscope (STEM) in which an aberration corrector 26 is incorporated in the irradiation optical system 20.

The electron source 10 emits an electron beam. The electron source 10 is, for example, an electron gun that accelerates electrons emitted from a cathode at an anode and emits an electron beam.

The electron optical system 2 includes the irradiation optical system 20 and the imaging optical system 40.

The irradiation optical system 20 irradiates a sample S with the electron beam emitted from the electron source 10. For example, the irradiation optical system 20 converges the electron beam emitted from the electron source 10 to form an electron probe and scans the sample S with the formed electron probe.

The imaging optical system 40 forms an image of the electrons that have been transmitted through the sample S. The electron beam that has been transmitted through the sample S is guided to the STEM detector 50 by the imaging optical system 40.

The STEM detector 50 detects the electrons that have been transmitted through the sample S. The STEM detector 50 is, for example, a dark-field STEM detector that detects electrons inelastically scattered at a high angle from the sample S with an annular detector.

The segmented detector 52 is a detector in which a detection surface 53 for detecting the electrons that have been transmitted through the sample S is divided into a plurality of detection regions.

Figure 2:
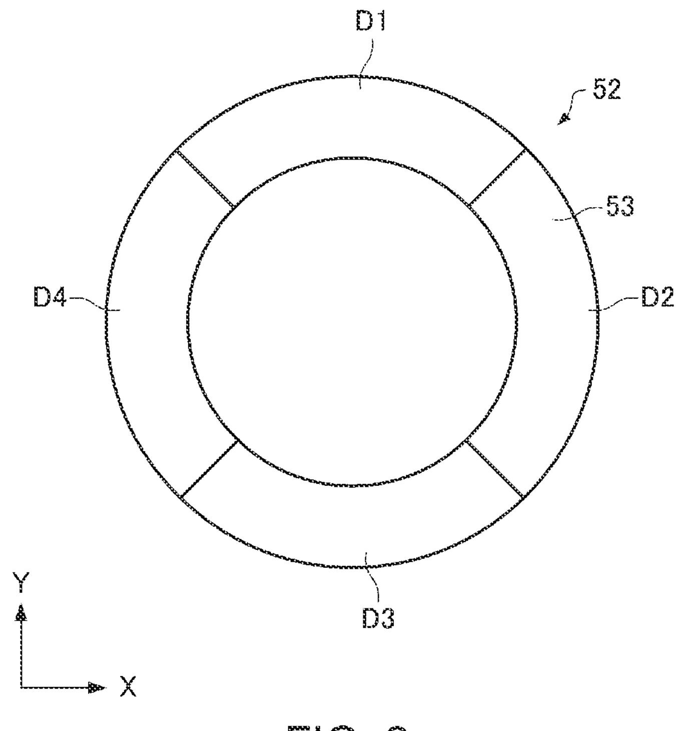
FIG. 2 is a diagram schematically illustrating a detection surface of a segmented detector.

FIG. 2 is a diagram schematically illustrating the detection surface 53 of the segmented detector 52.

The detection surface 53 of the segmented detector 52 is divided into a plurality of detection regions D1, D2, D3, and D4, as illustrated in FIG. 2. The segmented detector 52 has four detection regions D1, D2, D3, and D4 formed by equally dividing the annular detection surface 53 into four parts in an angular direction (a circumferential direction). Electrons can be detected independently in each of the detection regions D1, D2, D3, and D4.

The number of detection regions on the detection surface 53 is not particularly limited. Although not shown, the segmented detector 52 may have a plurality of detection regions formed by dividing the detection surface 53 in a radial direction and a declination direction (a circumferential direction) thereof. For example, the segmented detector 52 may have 16 detection regions formed by dividing the detection surface 53 into four in the radial direction and four in the declination direction.

The segmented detector 52 includes, for example, an electron-light conversion element (a scintillator) that converts electrons into light, an optical transmission line (an optical fiber bundle) that divides the electron-light conversion element into a plurality of detection regions D1, D2, D3, and D4 and transmits light from each of the detection regions D1, D2, D3, and D4, and a plurality of photodetectors (photomultiplier tubes) that convert the light transmitted from the optical transmission line for each of the detection regions D1, D2, D3, and D4 into an electrical signal. The segmented detector 52 outputs a detection signal corresponding to the intensity of the detected electrons for each of the detection regions D1, D2, D3, and D4. The segmented detector 52 may be a semiconductor detector having a plurality of detection regions.

The sample stage 30 supports the sample S held by a sample holder 32. The sample S can be positioned by the sample stage 30.

Figure 3:
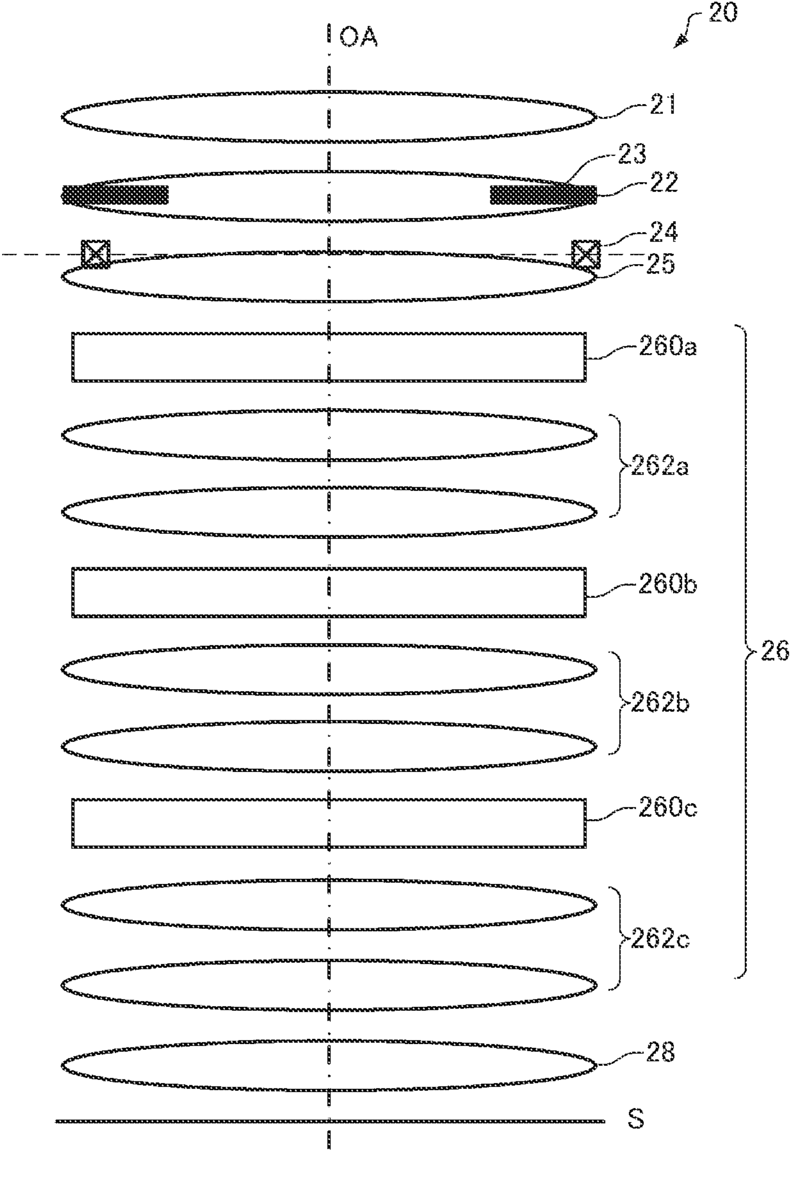
FIG. 3 is a diagram illustrating a configuration of an irradiation optical system.

The control unit 60 includes, for example, a processor such as a central processing unit (CPU) and a storage device (a memory) such as a random access memory (RAM) and a read only memory (ROM). The storage device stores programs for performing various controls and data. The functions of the control unit 60 can be realized by executing a program on the processor. The control unit 60 controls each part of the electron microscope 100. The control unit 60 controls each part of the electron microscope 100 via a drive circuit (not shown). FIG. 3 is a diagram illustrating a configuration of the irradiation optical system 20.

The irradiation optical system 20 includes a condenser lens 21, a condenser lens 22, a condenser aperture 23, a deflector 24, a condenser lens 25, and the aberration corrector 26, as illustrated in FIG. 3. The irradiation optical system 20 further includes a pre-magnetic field 28 that is created in front of the sample S by an objective lens.

The condenser lens 21, the condenser lens 22, and the condenser lens 25 are disposed in that order from a side of the electron source 10. The condenser aperture 23 is disposed within the condenser lens 22. The deflector 24 is disposed between the condenser lens 22 and the condenser lens 25. The electron beam can be deflected by the deflector 24.

The aberration corrector 26 is disposed between the condenser lens 25 and the pre-magnetic field 28 of the objective lens.

The aberration corrector 26 is incorporated in the irradiation optical system 20. The aberration corrector 26 is a spherical aberration corrector that corrects a spherical aberration of the irradiation optical system 20. The aberration corrector 26 includes a first multipole element 260*a*, a second multipole element 260*b*, a third multipole element 260*c*, a first transfer optical system 262*a*, a second transfer optical system 262*b*, and a third transfer optical system 262*c*. The aberration corrector 26 is a three-stage hexapole field type spherical aberration corrector in which multipole elements and transfer optical systems are alternately disposed and which has three stages of multipole elements and three stages of transfer optical systems.

The first multipole element 260*a*, the second multipole element 260*b*, and a third multipole element 260*c* are disposed along an optical axis OA. In the aberration corrector 26, a first multipole element 260*a*, a second multipole element 260*b*, and a third multipole element 260*c* are arranged in this order in the electron beam traveling direction.

The first multipole element 260*a* generates a magnetic hexapole field. A magnetic hexapole field is a magnetic field with 3-fold symmetry. The first multipole element 260*a* is, for example, a hexapole element or a dodecapole element. The first multipole element 260*a* is not limited to a hexapole element or a dodecapole element as long as it can generate a hexapole field.

The second multipole element 260*b* has the same configuration as the first multipole element 260*a*. That is, the second multipole element 260*b* is, for example, a hexapole element or a dodecapole element and generates a hexapole field.

The third multipole element 260*c* has the same configuration as the first multipole element 260*a*. That is, the third multipole element 260*c* is, for example, a hexapole element or a dodecapole element and generates a hexapole field.

The first transfer optical system 262*a* is disposed between the first multipole element 260*a* and the second multipole element 260*b*. The first transfer optical system 262*a* transfers the optical principal plane (the multipole element plane) of the first multipole element 260*a* to the optical principal plane of the second multipole element 260*b*. The first transfer optical system 262*a* transfers an image equivalent to an image obtained by the first multipole element 260*a* to the second multipole element 260*b*. For example, the first transfer optical system 262*a* is constituted by a plurality of electron lenses, and in the illustrated example, the first transfer optical system 262*a* is constituted by two electron lenses.

The second transfer optical system 262*b* is disposed between the second multipole element 260*b* and the third multipole element 260*c*. The second transfer optical system 262*b* transfers the optical principal plane of the second multipole element 260*b* to the optical principal plane of the third multipole element 260*c*. The second transfer optical system 262*b* transfers an image equivalent to an image obtained by the second multipole element 260*b* to the third multipole element 260*c*. For example, the second transfer optical system 262*b* is constituted by a plurality of electron lenses, and in the illustrated example, the second transfer optical system 262*b* is constituted by two electron lenses.

The third transfer optical system 262*c* is disposed between the third multipole element 260*c* and the pre-magnetic field 28 of the objective lens. The third transfer optical system 262*c* transfers the optical principal plane of the second multipole element 260*b* to the front focal plane of the objective lens. The third transfer optical system 262*c* transfers an image equivalent to an image obtained by the third multipole element 260*c* to the front focal plane of the objective lens. For example, the third transfer optical system 262*c* is constituted by a plurality of electron lenses, and in the illustrated example, the third transfer optical system 262*c* is constituted by two electron lenses.

The first multipole element 260*a* has a thickness with respect to a traveling direction of the electron beam. That is, the first multipole element 260*a* has a thickness along the optical axis OA. The first multipole element 260*a* generates a negative spherical aberration as a combination aberration of a three-fold astigmatism and a three-fold astigmatism in the thick hexapole field.

Here, the term "combination aberration" is a combination aberration generated by combination of aberration 1 and aberration 2 when an aberration (aberration 1) generated at a certain location propagates over a certain distance to change the point of incidence and influence of another aberration (aberration 2) is received.

Similarly, the second multipole element 260*b* has a thickness along the optical axis OA and generates a negative spherical aberration as a combination aberration of a three-fold astigmatism and a three-fold astigmatism in the thick hexapole field. Similarly, the third multipole element 260*c* has a thickness along the optical axis OA and generates a negative spherical aberration as a combination aberration of a three-fold astigmatism and a three-fold astigmatism in the thick hexapole field.

In the aberration corrector 26, each of the first multipole element 260*a*, the second multipole element 260*b*, and the third multipole element 260*c* generates a negative spherical aberration to cancel out a positive spherical aberration of the irradiation optical system 20. As a result, the spherical aberration of the irradiation optical system 20 can be corrected.

Furthermore, in the aberration corrector 26, a six-fold astigmatism derived from the hexapole field generated by the first multipole element 260*a*, a six-fold astigmatism derived from the hexapole field generated by the second multipole element 260*b*, and a six-fold astigmatism derived from the hexapole field generated by the third multipole element 260*c* are canceled out by relatively setting these 3 hexapole fields at specific angles.

For example, the hexapole field generated by the second multipole element 260*b* is rotated 40° clockwise about the optical axis OA with respect to the hexapole field generated by the first multipole element 260*a*. Further, the hexapole field generated by the third multipole element 260*c* is rotated 80° clockwise about the optical axis OA with respect to the hexapole field generated by the first multipole element 260*a*. As a result, it is possible to cancel out the six-fold astigmatism generated by each of three stages of hexapole fields.

The relationship between the rotation angles of the three stages of hexapole fields for canceling out the six-fold astigmatism is not limited to the above example. The relationship between the rotation angles of the three stages of hexapole fields for canceling out the six-fold astigmatism is described, for example, in JP-A-2009-054565.

Although not shown, the irradiation optical system 20 includes a scanning deflector that two-dimensionally deflects the electron beam. The scanning deflector can scan the sample S with the electron beam.

In the electron microscope 100, the electron beam emitted from the electron source 10 is converged by the irradiation optical system 20 to form the electron probe. The electron probe is two-dimensionally deflected by the irradiation optical system 20. As a result, the sample S can be scanned with the electron probe. The electron beam that has been transmitted through the sample S is guided to the STEM detector 50 by the imaging optical system 40 and detected by the STEM detector 50. For example, a scanning transmission electron microscope image (an STEM image) can be acquired by detecting the electrons that have been transmitted through the sample S by the STEM detector 50 in synchronization with the scanning with the electron probe. Since the aberration corrector 26 is incorporated in the irradiation optical system 20, a high-resolution STEM image can be obtained.

Further, with the electron microscope 100, a differential phase contrast image (a DPC image) can be acquired by a differential phase contrast method (a DPC method). For example, the electron microscope 100 scans the sample S with an electron beam, measures the deflection of the electron beam due to the electromagnetic field in the sample S at each point, and visualizes the electromagnetic field. The deflection of the electron beam due to the electromagnetic field in the sample S can be detected using the segmented detector 52. For example, it is possible to obtain a deflection amount and a deflection direction of the electron beam due to the electromagnetic field of the sample S from a difference I1−I3 between a detection signal I1 of the detection region D1 and a detection signal I3 of the detection region D3 and a difference I2−I4 between a detection signal I2 of the detection region D2 and a detection signal I4 of the detection region D4. The DPC image is a scanning transmission electron microscope image (a STEM image) obtained by visualizing the electromagnetic field in the sample which is acquired by the DPC method.

1.2. Operation

1.2.1. Operation Mode

In the electron microscope 100, the electron optical system 2 has a first mode in which the aberration corrector 26 operates as a three-stage hexapole field type spherical aberration corrector and a second mode in which the aberration corrector 26 operates as a two-stage hexapole field type spherical aberration corrector. The first mode is a mode suitable for acquiring a high-resolution STEM image. The second mode is a mode suitable for acquiring a DPC image. The control unit 60 operates the electron optical system 2 in the first mode or in the second mode in accordance with user's instructions.

1.2.2. First Mode

Figure 4:
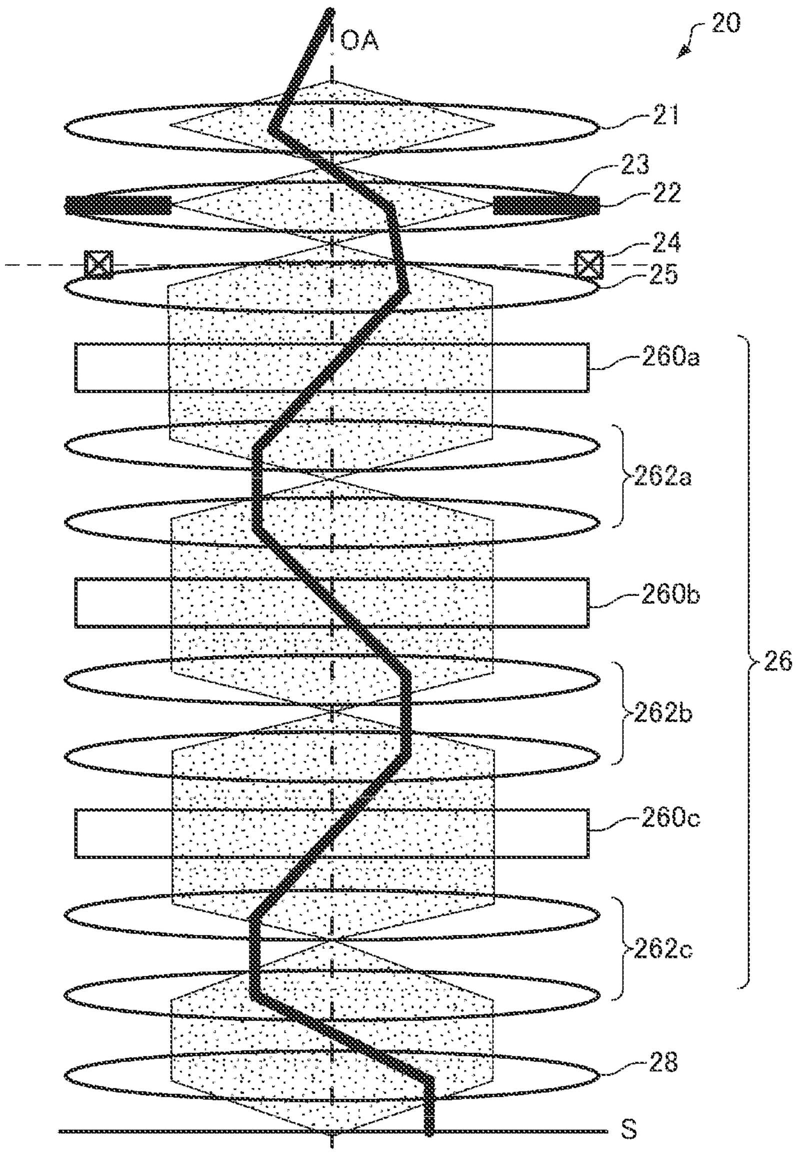
FIG. 4 is a diagram for explaining a first mode of an electron optical system.

FIG. 4 is a diagram for explaining the first mode of the electron optical system 2. FIG. 4 illustrates an example of a path of an electron beam in the first mode.

In the first mode, the electron beam can be largely converged to form an electron probe with an electron beam having a large convergence angle. As a result, it is possible to obtain a minute and high-intensity electron probe, and it is possible to acquire a high-resolution STEM image.

For example, as illustrated in FIG. 4, the convergence angle of the electron beam is adjusted using the condenser lens 22 and the condenser lens 25 disposed between the condenser aperture 23 and the aberration corrector 26. Furthermore, a focus on a sample plane is adjusted using the condenser lens 22 and the condenser lens 25. That is, the electron beam on the sample plane is focused using the condenser lens 22 and the condenser lens 25.

Further, spherical aberration and six-fold astigmatism are corrected using the aberration corrector 26 as the three-stage hexapole field type spherical aberration corrector. That is, the first multipole element 260*a*, the second multipole element 260*b*, and the third multipole element 260*c* are excited. By correcting aberration of the irradiation optical system 20 with the aberration corrector 26, it is possible to obtain a minute and high-intensity electron probe.

1.2.3. Second Mode

Figure 5:
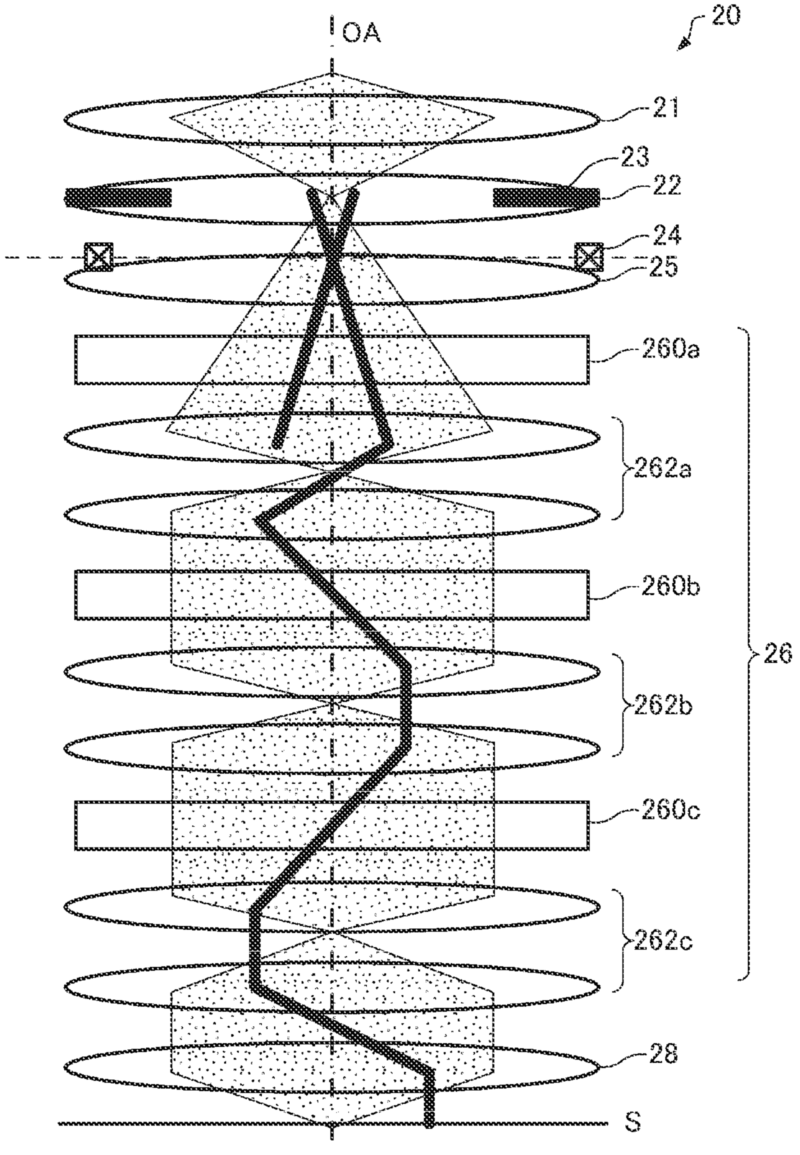
FIG. 5 is a diagram for explaining a second mode of an electron optical system.

FIG. 5 is a diagram for explaining the second mode of the electron optical system 2. FIG. 5 illustrates an example of a path of an electron beam in the second mode.

In order to acquire a DPC image, in addition to adjusting the convergence angle of the electron beam and adjusting the focus on the sample plane, it is necessary to focus the condenser aperture 23 on a reciprocal space and to adjust a position of crossover in some cases. When the DPC image is acquired, for example, the condenser aperture 23 is focused on the reciprocal space (the focal plane). Further, when the DPC image is acquired, for example, the position of the crossover is aligned with the position of the deflector 24.

However, in the first mode illustrated in FIG. 4, since adjusting the convergence angle of the electron beam and adjusting the focus on the sample plane are performed using the condenser lens 22 and the condenser lens 25, it is not possible to focus the condenser aperture 23 on the reciprocal space and to adjust the position of the crossover. Thus, in the first mode, the degree of freedom in adjusting the irradiation optical system 20 is insufficient.

Therefore, in the second mode, aberration is corrected by exciting the second multipole element 260*b* and the third multipole element 260*c* of the aberration corrector 26 without exciting the first multipole element 260*a* of the aberration corrector 26. At this time, the focusing of the condenser aperture 23 on the reciprocal space and the adjustment of the position of the crossover are performed using the first transfer optical system 262*a*, which is not disposed between the second multipole element 260*b* and the third multipole element 260*c*.

In the second mode, the aberration corrector 26 functions as a two-stage hexapole field type spherical aberration corrector. For example, the third multipole element 260*c* in the second stage generates a hexapole field whose polarity is opposite to that of the hexapole field generated by the second multipole element 260*b* in the first stage. The second transfer optical system 262*b* transfers the optical principal plane of the second multipole element 260*b* to the optical principal plane of the third multipole element 260*c*. The third transfer optical system 262*c* transfers the optical principal plane of the second multipole element 260*b* to the front focal plane of the objective lens.

In the aberration corrector 26 functioning as a two-stage hexapole field type spherical aberration corrector, each of the second multipole element 260*b* in the first stage and the third multipole element 260*c* in the second stage generates a negative spherical aberration to cancel out a positive spherical aberration of the irradiation optical system 20. As a result, the spherical aberration of the irradiation optical system 20 can be corrected.

Further, since the third multipole element 260*c* in the second stage generates a hexapole field whose polarity is opposite to that of the hexapole field generated by the second multipole element 260*b* in the first stage, in the hexapole field in the second stage, a three-fold astigmatism in a direction opposite to the three-fold astigmatism generated in the hexapole field in the first stage is generated. As a result, the three-fold astigmatism generated in the hexapole field in the first stage and a tripole field generated in the hexapole field in the second stage can be canceled out.

In the two-stage hexapole field type spherical aberration corrector, a six-fold astigmatism, which could be canceled out in the three-stage hexapole field type spherical aberration corrector, remains.

In the second mode, since the first multipole element 260*a* is not used as described above, the first transfer optical system 262*a* can be used for purposes other than aberration correction. That is, in addition to the condenser lens 22 and the condenser lens 25, the two electron lenses that make up the first transfer optical system 262*a* can be used for purposes other than aberration correction. In the second mode, for example, the two electron lenses that make up the first transfer optical system 262*a* can be used to focus the condenser aperture 23 on the reciprocal space and to adjust the position of the crossover without functioning as the transfer optical system.

Therefore, in the second mode, it is possible to perform adjusting the convergence angle of the electron beam and adjusting the focus on the sample plane using the condenser lens 22 and the condenser lens 25, and it is possible to perform focusing the condenser aperture 23 on the reciprocal space and adjusting the position of the crossover using the two electron lenses that make up the first transfer optical system 262*a*.

As a result, in the second mode, the convergence angle can be reduced in a state where aberration is corrected, and a contrast corresponding to a sample structure can be enhanced in the DPC method.

1.3. Method of Adjusting Electron Optical System

Figure 6:
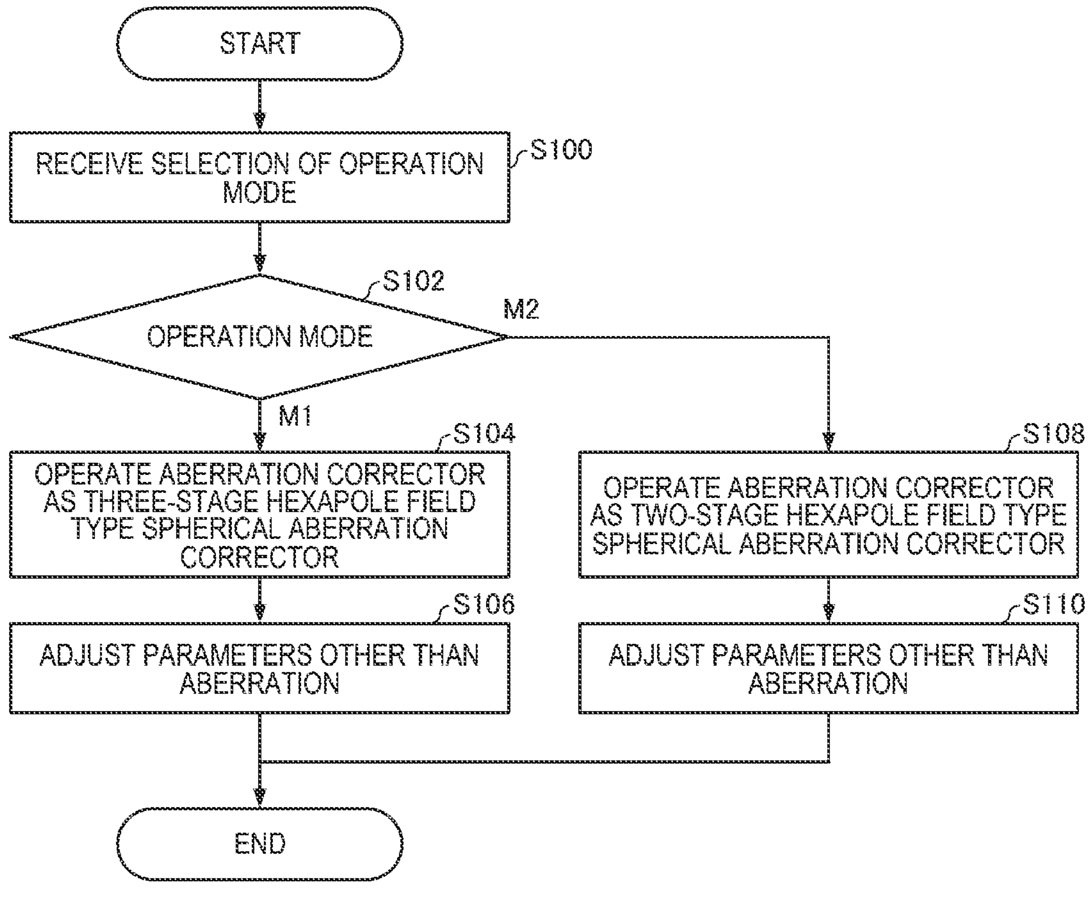
FIG. 6 is a flowchart illustrating an example of adjustment processing for an electron optical system, performed by a control unit.

FIG. 6 is a flowchart illustrating an example of adjustment processing for the electron optical system 2, performed by the control unit 60.

The control unit 60 receives selection of an operation mode (S100). For example, when the user selects either the first mode or the second mode, the control unit 60 receives the selection of this operation mode. The selection of the operation mode is performed by operating an input device such as a button, a mouse, and a key, or by operating a Graphical User Interface (GUI).

In a case where the first mode is selected (M1 in S102), the control unit 60 excites the first multipole element 260*a*, the second multipole element 260*b*, and the third multipole element 260*c* of the aberration corrector 26 and operates the aberration corrector 26 as a three-stage hexapole field type spherical aberration corrector (S104). As a result, it possible to correct the six-fold astigmatism caused by the hexapole field generated by the aberration corrector 26 while the spherical aberration of the irradiation optical system 20 is corrected.

The control unit 60 adjusts the parameters of the electron optical system 2 other than aberration (S106).

The control unit 60 adjusts the convergence angle of the electron beam and the focus of the electron beam on the sample plane using, for example, the condenser lens 22 and the condenser lens 25. The control unit 60 operates the condenser lens 22 and the condenser lens 25 to obtain a preset convergence angle, for example. Further, the control unit 60 operates the condenser lens 22 and the condenser lens 25 such that the electron beam is focused on the sample plane. Adjusting the focus is performed using, for example, a well-known autofocus function.

Through the above processing, it is possible to operate the electron optical system 2 in the first mode. By operating the electron optical system 2 in the first mode, it is possible to obtain a minute and high-intensity electron probe, and it is possible to acquire a high-resolution STEM image.

In a case where the second mode is selected (M2 in S102), the control unit 60 sets the excitation of the first multipole element 260*a* of the aberration corrector 26 to zero, excites the second multipole element 260*b* and the third multipole element 260*c* of the aberration corrector 26, and operates the aberration corrector 26 as a two-stage hexapole field type spherical aberration corrector (S108).

The control unit 60 adjusts the parameters of the electron optical system 2 other than aberration (S110).

The control unit 60 adjusts the convergence angle of the electron beam and the focus of the electron beam on the sample plane using the condenser lens 22 and the condenser lens 25.

Further, the control unit 60 performs focusing the condenser aperture 23 on the reciprocal space and adjusting the position of the crossover using the two electron lenses that make up the first transfer optical system 262*a* of the aberration corrector 26. For example, the control unit 60 acquires an image of the condenser aperture 23 and operates the first transfer optical system 262*a* such that the condenser aperture 23 is focused on the reciprocal space. For example, the control unit 60 operates the two electron lenses that make up the first transfer optical system 262*a* such that the position of the crossover matches the position of the deflector 24.

Through the above processing, it is possible to operate the electron optical system 2 in the second mode. By operating the electron optical system 2 in the second mode, it is possible to acquire a DPC image by the DPC method, for example.

In the above, the case where the control unit 60 adjusts the electron optical system 2 has been illustrated, but a user may perform the adjustment of the electron optical system 2 manually.

1.4. Effect

In the method of adjusting the electron optical system 2 in the electron microscope 100, aberration is adjusted using the second multipole element 260*b* and the third multipole element 260*c* without using the first multipole element 260*a*, and the parameters of the electron optical system 2 other than aberration are adjusted using the first transfer optical system 262*a* that is not disposed between the second multipole element 260*b* and the third multipole element 260*c* which are used. For this reason, in the method of adjusting the electron optical system 2, the parameters other than aberration can be adjusted using the aberration corrector 26. Therefore, the degree of freedom in adjusting the electron optical system 2 can be improved without increasing the size of the apparatus.

For example, in the first mode illustrated in FIG. 4, there are two lenses, the condenser lens 22 and the condenser lens 25, that can be used for adjusting the parameters other than aberration correction. For this reason, in a case where the convergence angle of the electron beam, the focus on the sample plane, the focus of the condenser aperture 23 on the reciprocal space, and the position of the crossover are adjusted, the degree of freedom in adjusting the electron optical system 2 is insufficient in the first mode.

Further, if a lens is added in order to improve the degree of freedom in adjusting the electron optical system 2, the height of the apparatus will increase and the size of the apparatus will increase. In addition, the number of parts of the apparatus increases, and the apparatus becomes expensive.

On the other hand, in the second mode, the parameters of the electron optical system 2 other than aberration can be adjusted using the transfer optical system that is not disposed between the two multipole elements used without using one multipole element of the aberration corrector 26. For this reason, the degree of freedom in adjusting the electron optical system 2 can be improved without increasing the size of the apparatus. In the second mode, the convergence angle of the electron beam, the focus on the sample plane, the focus of the condenser aperture 23 on the reciprocal space, and the position of the crossover can be adjusted using the condenser lens 22, the condenser lens 25, and the two electron lenses that make up the first transfer optical system 262*a*. Since the DPC method does not require a resolution as high as that for obtaining a high-resolution STEM image, an excellent DPC image can be obtained even with a two-stage hexapole field type spherical aberration corrector.

In the method of adjusting the electron optical system 2 in the electron microscope 100, in the second mode, at least one of adjusting the convergence angle of the electron beam, focusing the condenser aperture 23 on the reciprocal space, and adjusting the position of the crossover is performed using the first transfer optical system 262*a*. For this reason, in the electron microscope 100, these parameters can be adjusted without increasing the size of the device.

The electron microscope 100 has the first mode in which aberration is adjusted using all of the multipole elements of the aberration corrector 26 and the second mode in which aberration is adjusted using the second multipole element 260*b* and the third multipole element 260*c* without using the first multipole element 260*a* and the parameters of the electron optical system 2 other than aberration are adjusted using the first transfer optical system 262*a* that is not disposed between the second multipole element 260*b* and the third multipole element 260*c* which are used. For this reason, in the electron microscope 100, a high-resolution STEM image can be acquired using the first mode, and a DPC image can be acquired using the second mode.

Further, in the electron microscope 100, the degree of freedom in adjusting the electron optical system 2 can be improved without increasing the size of the apparatus.

1.5. Modification Example

Figure 7:
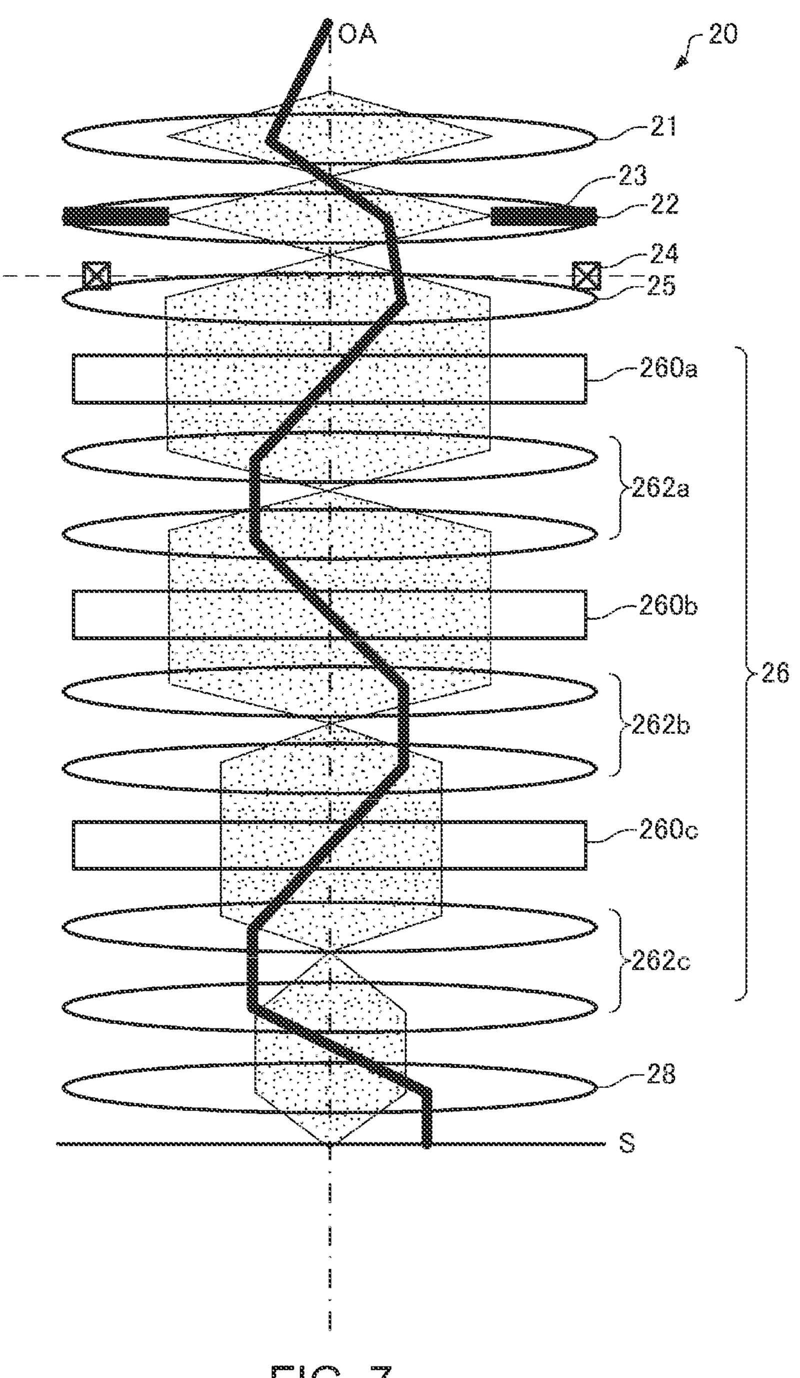
FIG. 7 is a diagram for explaining a modification example of a second mode of an electron optical system.

FIG. 7 is a diagram for explaining a modification example of the second mode of the electron optical system 2.

In the above-described second mode illustrated in FIG. 5, aberration has been adjusted by exciting the second multipole element 260*b* in the second stage and the third multipole element 260*c* in the third stage without exciting the first multipole element 260*a* in the first stage, and the parameters other than aberration have been adjusted using the first transfer optical system 262*a*. On the other hand, in the second mode illustrated in FIG. 7, aberration is adjusted by exciting the first multipole element 260*a* in the first stage and the second multipole element 260*b* in the second stage without exciting the third multipole element 260*c* in the third stage, and the parameters other than aberration are adjusted using the third transfer optical system 262*c*.

The second mode illustrated in FIG. 7 in which the third multipole element 260*c* is not excited is suitable for making the convergence angle of the electron beam extremely smaller than the second mode illustrated in FIG. 5 in which the first multipole element 260*a* is not excited. The second mode illustrated in FIG. 7 in which the third multipole element 260*c* is not excited is suitable for nano-beam diffraction, for example. The nano-beam diffraction is a technique for qualitative analysis or quantitative analysis of a crystal structure by irradiating a nearly parallel incident electron beam onto a minute region of nanometer order to obtain a relatively sharp diffraction pattern.

Here, in a case where the convergence angle is extremely small, the spherical aberration of the electron source 10 (the electron gun) may become more dominant than the spherical aberration of the objective lens. In this case, in the second mode in which the third multipole element 260*c* is not excited, it is possible to correct the spherical aberration of the electron source 10 by controlling a reduction rate between the electron source 10 and the aberration corrector 26 using the condenser lens 21, the condenser lens 22, and the condenser lens 25. Furthermore, the reduction rate can be reduced using the third transfer optical system 262*c*. As a result, the spherical aberration of the electron source 10 can be corrected.

In the modification example, the electron optical system 2 has the second mode illustrated in FIG. 7 in which the third multipole element 260*c* is not excited in addition to the first mode illustrated in FIG. 4 and the second mode illustrated in FIG. 5 in which the first multipole element 260*a* is not excited. The control unit 60 receives the selection of these three operation modes and controls the electron optical system 2 to be in the selected operation mode.

Thus, the electron microscope 100 includes the aberration corrector 26 having three stages of multipole element, wherein aberration is adjusted using two multipole elements without using one multipole element, and the parameters of the electron optical system 2 other than aberration are adjusted using the transfer optical system that is not disposed between the excited multipole elements. Therefore, in the electron microscope 100, the degree of freedom in adjusting the electron optical system 2 can be improved without increasing the size of the apparatus.

In the adjusting method in the electron microscope 100, in the aberration corrector 26, aberration is adjusted by exciting the first multipole element 260*a* in the first stage and the second multipole element 260*b* in the second stage without exciting the third multipole element 260*c* in the third stage, and the parameters of the electron optical system 2 other than aberration are adjusted using the third transfer optical system 262*c* in the third stage. For this reason, the degree of freedom in adjusting the electron optical system 2 can be improved without increasing the size of the apparatus.

2. Second Embodiment

2.1. Electron Microscope

Figure 8:
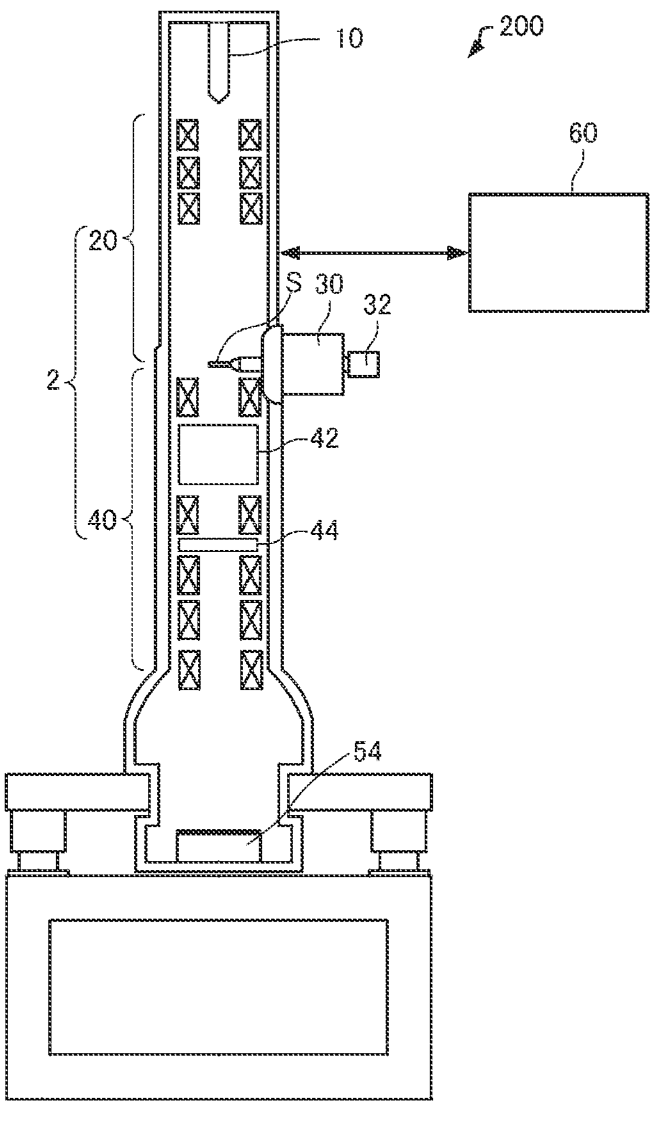
FIG. 8 is a diagram illustrating a configuration of an electron microscope according to the second embodiment.

Next, an electron microscope according to the second embodiment will be described with reference to the drawings. FIG. 8 is a diagram illustrating a configuration of an electron microscope 200 according to the second embodiment. Hereinafter, in the electron microscope 200 according to the second embodiment, the members having the same functions as the constituent members of the electron microscope 100 according to the first embodiment are designated by the same reference signs, and detailed description thereof will be omitted.

The above-described electron microscope 100 illustrated in FIG. 1 is a scanning transmission electron microscope (STEM) in which the aberration corrector 26 is incorporated in the irradiation optical system 20, but the electron microscope 200 illustrated in FIG. 8 is a transmission electron microscope (TEM) in which an aberration corrector 42 is incorporated in the imaging optical system 40.

As illustrated in FIG. 8, the electron microscope 200 includes an electron source 10, an electron optical system 2 including an irradiation optical system 20 and an imaging optical system 40, a sample stage 30, a detector 54, and a control unit 60.

The imaging optical system 40 includes an aberration corrector 42 and a biprism 44.

The aberration corrector 42 corrects the aberration of the imaging optical system 40. Details of the aberration corrector 42 will be described below.

The biprism 44 is an electron wave interferometer used to obtain an electron hologram. The biprism 44 includes a thread-like electrode disposed perpendicular to the electron beam and ground electrodes disposed on both sides of the thread-like electrode. The biprism 44 is installed such that a positive voltage is applied to the thread-like electrode, a scattered wave (an object wave) that has been transmitted through a sample S passes through one side of the thread-like electrode, and a wave (a reference wave) coming directly from the electron source 10 passes through the other side of the thread-like electrode. The two waves are deflected to be attracted to a positive electrode and overlap each other to form an interference fringe (a hologram). This hologram contains information on a change in amplitude and phase due to the sample S.

The detector 54 detects the electrons that have been transmitted through the sample S. The detector 54 is an imaging device that captures an image formed by the imaging optical system 40. The detector 54 is, for example, a digital camera such as a charge coupled device (CCD) camera.

Figure 9:
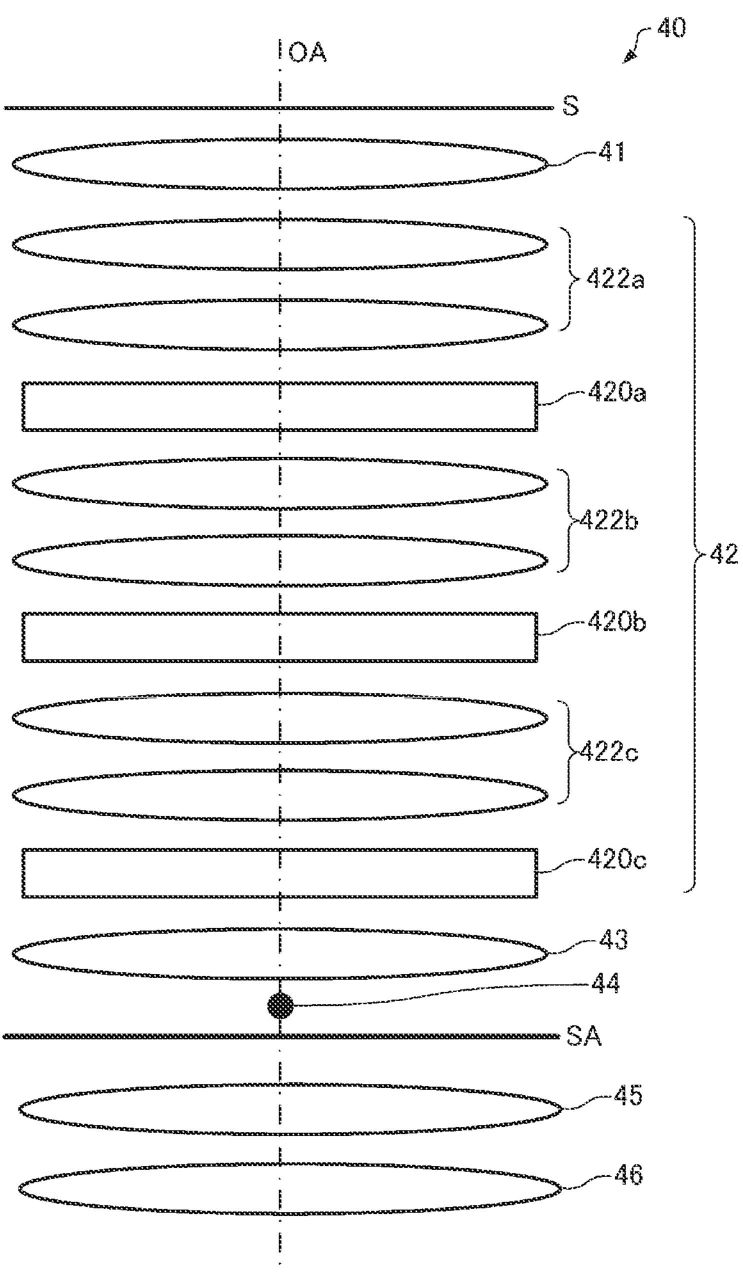
FIG. 9 is a diagram illustrating a configuration of an imaging optical system.

FIG. 9 is a diagram illustrating a configuration of the imaging optical system 40 of the electron microscope 200.

As illustrated in FIG. 9, the imaging optical system 40 includes a post-magnetic field 41 generated behind the sample S by an objective lens, the aberration corrector 42, a magnification adjustment lens 43, the biprism 44, an intermediate lens 45, and an intermediate lens 46. The imaging optical system 40 further includes a projection lens (not shown).

The aberration corrector 42 is disposed between the post-magnetic field 41 and the magnification adjustment lens 43. The aberration corrector 42 is a spherical aberration corrector that corrects a spherical aberration of the imaging optical system 40. The aberration corrector 42 includes a first multipole element 420*a*, a second multipole element 420*b*, a third multipole element 420*c*, a first transfer optical system 422*a*, a second transfer optical system 422*b*, and a third transfer optical system 422*c*. The aberration corrector 42 is a three-stage hexapole field type spherical aberration corrector in which multipole elements and transfer optical systems are alternately disposed and which has three stages of multipole elements and three stages of transfer optical systems.

The configurations of the first multipole element 420*a*, the second multipole element 420*b*, and the third multipole element 420*c* are the same as those of the first multipole element 260*a*, the second multipole element 260*b*, and the third multipole element 260*c* described above.

The first transfer optical system 422*a* is disposed between the post-magnetic field 41 and the first multipole element 420*a*. The first transfer optical system 422*a* transfers the back focal plane to the optical principal plane (the multipole element plane) of the first multipole element 420*a*. The first transfer optical system 422*a* transfers an image equivalent to an image obtained by the objective lens to the first multipole element 420*a*. The first transfer optical system 422*a* is constituted by, for example, a plurality of electron lenses, and in the illustrated example, the first transfer optical system 422*a* is constituted by two electron lenses.

The second transfer optical system 422*b* is disposed between the first multipole element 420*a* and the second multipole element 420*b*. The second transfer optical system 422*b* transfers the optical principal plane of the first multipole element 420*a* to the optical principal plane of the second multipole element 420*b*. The second transfer optical system 422*b* transfers an image equivalent to an image obtained by the first multipole element 420*a* to the second multipole element 420*b*. For example, the second transfer optical system 422*b* is constituted by a plurality of electron lenses, and in the illustrated example, the second transfer optical system 422*b* is constituted by two electron lenses.

The third transfer optical system 422*c* is disposed between the second multipole element 420*b* and the third multipole element 420*c*. The third transfer optical system 422*c* transfers the optical principal plane of the second multipole element 420*b* to the optical principal plane of the third multipole element 420*c*. The third transfer optical system 422*c* transfers an image equivalent to an image obtained by the second multipole element 420*b* to the third multipole element 420*c*. For example, the third transfer optical system 422*c* is constituted by a plurality of electron lenses, and in the illustrated example, the third transfer optical system 422*c* is constituted by two electron lenses.

The principle of correcting the aberration of the imaging optical system 40 with the aberration corrector 42 is the same as the principle of correcting the aberration of the irradiation optical system 20 with the aberration corrector 26, and the explanation thereof will be omitted.

The magnification adjustment lens 43 is disposed behind the aberration corrector 42. The image of electrons emitted from the aberration corrector 42 is formed on a selected-area aperture plane SA by the magnification adjustment lens 43 at a predetermined magnification.

The biprism 44 is disposed between the magnification adjustment lens 43 and the intermediate lens 45.

The intermediate lens 45 and the intermediate lens 46 are disposed between the magnification adjustment lens 43 and the projection lens. The intermediate lens 45 is used, for example, for focusing, and the intermediate lens 46 is used, for example, for image magnification.

The projection lens (not shown) further magnifies the image magnified by the intermediate lens 45 and the intermediate lens 46 and forms an image on the detector 54.

In the electron microscope 200, the electron beam emitted from the electron source 10 is converged by the irradiation optical system 20 and applied to the sample S. The sample S is irradiated with, for example, a parallel beam. The electron beam that has been transmitted through the sample S forms a transmission electron microscope image (a TEM image) by the imaging optical system 40. The TEM image is captured by the detector 54. In the electron microscope 200, since the aberration of the imaging optical system 40 can be corrected by the aberration corrector 42, a high-resolution TEM image can be obtained.

Further, in the electron microscope 200, a phase reconstruction image can be obtained by electron holography. The electron holography is a technique that utilizes the coherence of electron waves and reconstructs a phase change that the electron waves receive from the sample. For example, a wave (an object wave) that has been transmitted through the sample S and has received a phase change and a wave (a reference wave) that has passed through a vacuum from the electron source 10 and is not affected by the sample S are caused to interfere with each other by the biprism 44, and thus an interference fringe (a hologram) is obtained. The obtained hologram is subjected to Fourier transform, equally spaced main interference components that make up a background are removed by masking, and a modulated component (a side band) of a diffracted wave that has been transmitted through the sample S is extracted and subjected to inverse Fourier transform, and thus the phase is reconstructed at the bottom plane of the sample. As a result, it is possible to obtain the phase reconstruction image.

2.2. Operation

2.2.1. Operation Mode of Electron Microscope

In the electron microscope 200, similarly to the electron microscope 100, the electron optical system 2 has a first mode in which the aberration corrector 42 operates as a three-stage hexapole field type spherical aberration corrector and a second mode in which the aberration corrector 42 operates as a two-stage hexapole field type spherical aberration corrector. The control unit 60 operates the electron optical system 2 in the first mode or in the second mode in accordance with user's instructions.

2.2.2. First Mode

Figure 10:
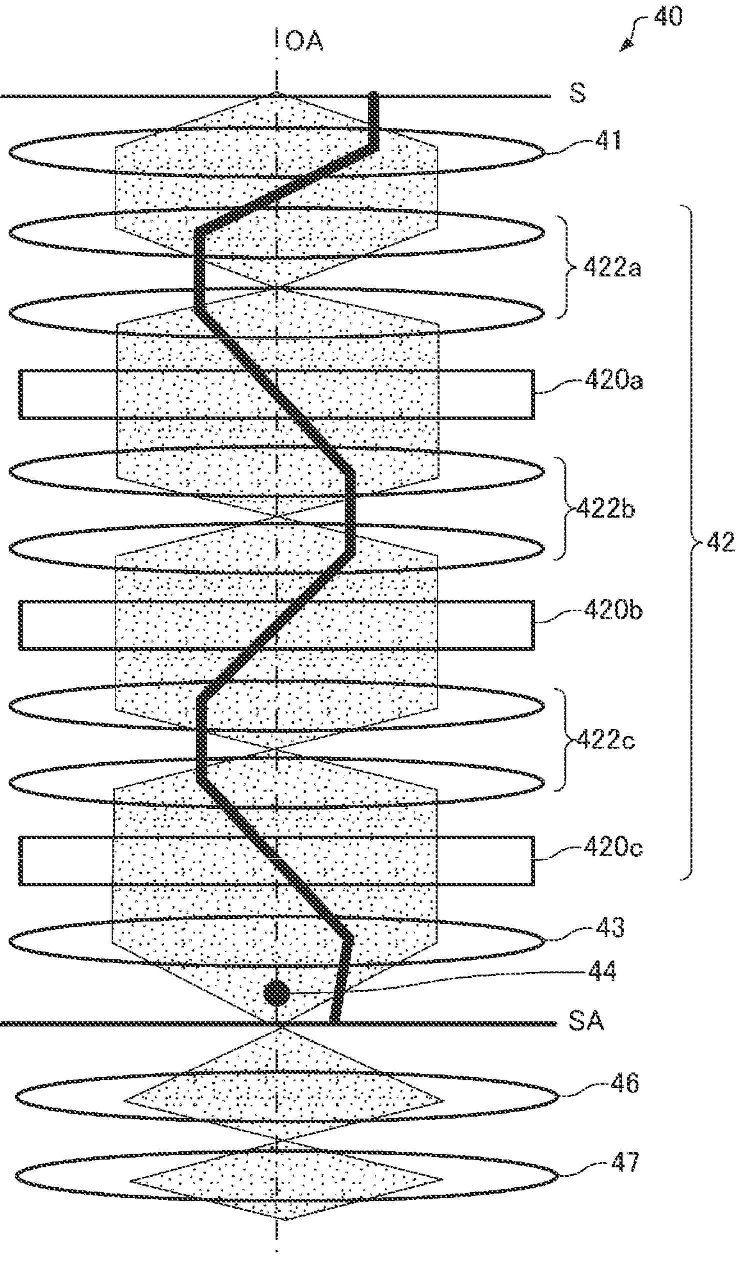
FIG. 10 is a diagram for explaining a first mode of an electron optical system.

FIG. 10 is a diagram for explaining the first mode of the electron optical system 2. FIG. 10 illustrates an example of a path of an electron beam in the first mode.

In the first mode, the aberration corrector 42 is used as the three-stage hexapole field type spherical aberration corrector to correct spherical aberration and six-fold astigmatism. As a result, it is possible to acquire a high-resolution TEM image.

2.2.3. Second Mode

Figure 11:
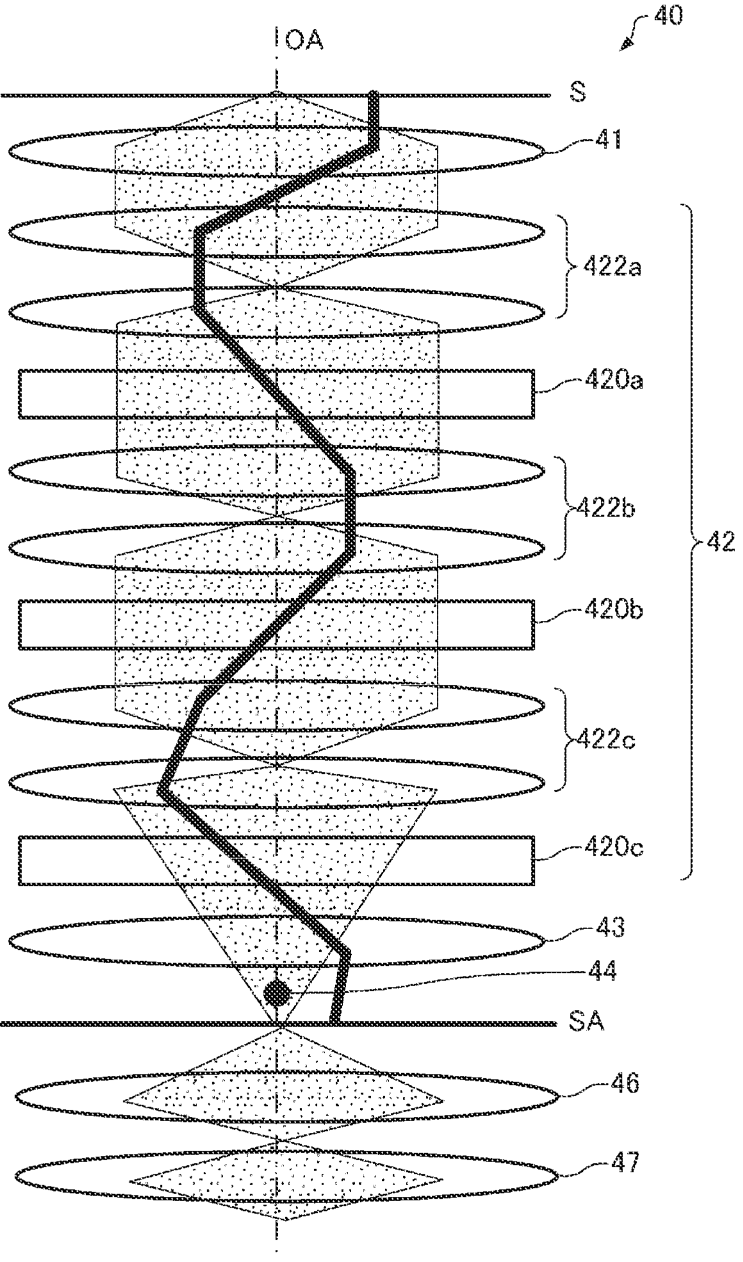
FIG. 11 is a diagram for explaining a second mode of an electron optical system.

FIG. 11 is a diagram for explaining the second mode of the electron optical system 2. FIG. 11 illustrates an example of a path of an electron beam in the second mode.

In order to acquire a hologram, for example, it is necessary to adjust the magnification of the selected-area aperture plane SA, adjust the crossover position on the upstream side of the biprism 44, and adjust the magnification of the image plane on the downstream side of the biprism 44 in some cases.

However, in the above-described first mode illustrated in FIG. 10, there is only the magnification adjustment lens 43 between the aberration corrector 42 and the selected-area aperture plane SA. Thus, in the first mode, the degree of freedom in adjusting the imaging optical system 40 is insufficient.

Therefore, in the second mode, aberration is corrected by exciting the first multipole element 420*a* and the second multipole element 420*b* of the aberration corrector 42 without exciting the third multipole element 420*c* of the aberration corrector 42. At this time, parameters of the imaging optical system 40 other than aberration are adjusted using the third transfer optical system 422*c* that is not disposed between the first multipole element 420*a* and the second multipole element 420*b*.

In the second mode, the aberration corrector 42 functions as a two-stage hexapole field type spherical aberration corrector. For example, the second multipole element 420*b* in the second stage generates a hexapole field whose polarity is opposite to that of the hexapole field generated by the first multipole element 420*a* in the first stage. The first transfer optical system 422*a* transfers the back focal plane of the objective lens to the optical principal plane of the first multipole element 420*a*. The second transfer optical system 422*b* transfers the optical principal plane of the first multipole element 420*a* to the optical principal plane of the second multipole element 420*b*.

In the second mode, since the third multipole element 420*c* is not used as described above, the third transfer optical system 422*c* can be used for purposes other than aberration correction. That is, in addition to the magnification adjustment lens 43, the two electron lenses that make up the third transfer optical system 422*c* can be used for purposes other than aberration correction. In the second mode, for example, the two electron lenses that make up the third transfer optical system 422*c* can be used to adjust the magnification of the selected-area aperture plane SA, adjust the crossover position on the upstream side of the biprism 44, and adjust the magnification of the image plane on the downstream side of the biprism 44 without functioning as the transfer optical system.

Therefore, in the second mode, it is possible to perform adjusting the magnification of the selected-area aperture plane SA, adjusting the crossover position on the upstream side of the biprism 44, and adjusting the magnification of the image plane on the downstream side of the biprism 44 using the magnification adjustment lens 43 and the two electron lenses that make up the third transfer optical system 422*c*.

As a result, in the second mode, a hologram can be obtained with aberration corrected.

2.3. Method of Adjusting Electron Optical System

The adjustment processing of the control unit 60 in the electron microscope 200 is the same as the adjustment processing of the control unit 60 in the electron microscope

100 illustrated in FIG. 6 described above except that the adjustment processing of the parameters other than aberration is different, and a detailed description thereof is omitted. In the electron microscope 200, similarly to the electron microscope 100, the imaging optical system 40 can be operated in the first mode or the second mode according to the user's selection.

2.4. Effect

In the method of adjusting the electron optical system 2 in the electron microscope 200, the imaging optical system 40 includes the aberration corrector 42, wherein aberration is adjusted using the first multipole element 420*a* in the first stage and the second multipole element 420*b* in the second stage without using the third multipole element 420*c* in the third stage, and the parameters of the electron optical system 2 other than aberration are adjusted using the third transfer optical system 422*c* in the third stage. For this reason, the degree of freedom in adjusting the electron optical system 2 can be improved without increasing the size of the apparatus.

The electron microscope 200 has the first mode in which aberration is adjusted using all of the multipole elements of the aberration corrector 42 and the second mode in which aberration is adjusted using the first multipole element 420*a* and the second multipole element 420*b* without using the third multipole element 420*c* and the parameters of the electron optical system 2 other than aberration are adjusted using the third transfer optical system 422*c* that is not disposed between the first multipole element 420*a* and the second multipole element 420*b* which are used. For this reason, in the electron microscope 200, a high-resolution TEM image can be acquired using the first mode, and a hologram can be acquired using the second mode. Moreover, the degree of freedom in adjusting the electron optical system 2 can be improved without increasing the size of the apparatus.

2.5. Modification Example

2.5.1. First Modification Example

In the example illustrated in FIG. 11 described above, in the second mode, aberration is adjusted by exciting the first multipole element 420*a* and the second multipole element 420*b* without exciting the third multipole element 420*c*, and the parameters of the electron optical system 2 other than aberration are adjusted using the third transfer optical system 422*c* that is not disposed between the first multipole element 420*a* and the second multipole element 420*b* which are excited. On the other hand, in the second mode, aberration may be adjusted by exciting the second multipole element 420*b* and the third multipole element 420*c* without exciting the first multipole element 420*a*, and the parameters of the electron optical system 2 other than aberration may be adjusted using the first transfer optical system 422*a* that is not disposed between the second multipole element 420*b* and the third multipole element 420*c*.

In the first modification example, the electron microscope 200 has the second mode in which the first multipole element 420*a* is not excited in addition to the first mode illustrated in FIG. 10 and the second mode illustrated in FIG. 11 in which the third multipole element 420*c* is not excited. The control unit 60 receives the selection of these three operation modes and controls the electron optical system 2 to be in the selected operation mode.

Thus, the electron microscope 200 includes the aberration corrector 26 having three stages of multipole element, wherein aberration is adjusted by exciting two multipole elements without exciting one multipole element and the parameters of the electron optical system 2 other than aberration are adjusted using the transfer optical system that is not disposed between the excited multipole elements. Therefore, in the electron microscope 200, the degree of freedom in adjusting the electron optical system 2 can be improved without increasing the size of the apparatus.

2.5.2. Second Modification Example

In the electron microscope according to the first embodiment, the aberration corrector 26 is incorporated in the irradiation optical system 20 as illustrated in FIG. 3, and in the electron microscope according to the second embodiment, the aberration corrector 42 is incorporated in the imaging optical system 40 as illustrated in FIG. 9, but it is also possible that the aberration corrector 26 is incorporated in the irradiation optical system 20 and the aberration corrector 42 is incorporated in the imaging optical system 40.

3. Third Embodiment

3.1. Electron Microscope

Next, an electron microscope according to the third embodiment will be described. The electron microscope according to the third embodiment has the same configuration as the electron microscope 100 illustrated in FIG. 1 except that the aberration corrector 26 is a four-stage hexapole field type spherical aberration corrector. Hereinafter, points different from the above example of the electron microscope 100 according to the first embodiment will be described, and description of the same points will be omitted.

Figure 12:
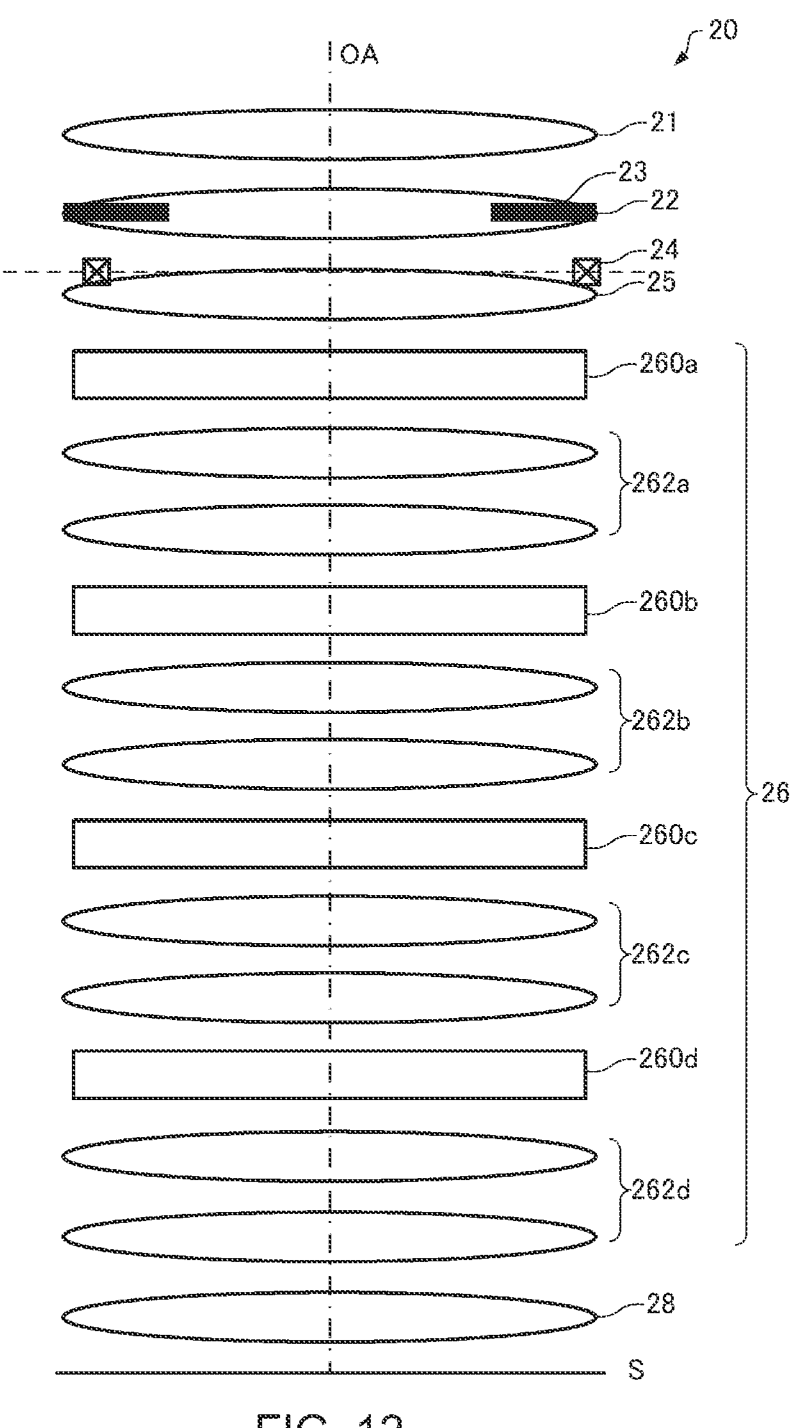
FIG. 12 is a diagram illustrating a configuration of an aberration corrector of an electron microscope according to the third embodiment.

FIG. 12 is a diagram illustrating a configuration of an aberration corrector 26 of the electron microscope according to the third embodiment.

As illustrated in FIG. 12, the aberration corrector 26 includes a first multipole element 260*a*, a second multipole element 260*b*, a third multipole element 260*c*, a fourth multipole element 260*d*, a first transfer optical system 262*a*, a second transfer optical system 262*b*, a third transfer optical system 262*c*, and a fourth transfer optical system 262*d*. The aberration corrector 26 is a four-stage hexapole field type spherical aberration corrector in which multipole elements and transfer optical systems are alternately disposed and which has four stages of multipole elements and four stages of transfer optical systems.

Figure 13:
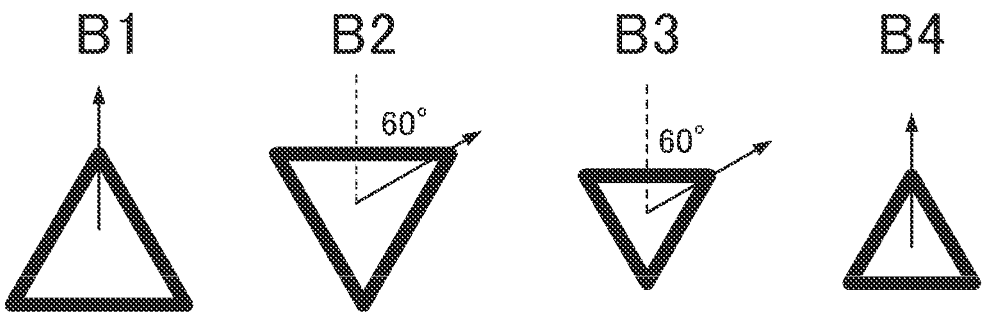
FIG. 13 is a diagram for explaining a three-fold astigmatism generated by each of four stages of multipole elements.

FIG. 13 is a diagram for explaining a three-fold astigmatism generated by each of four stages of multipole elements. In FIG. 13, a three-fold astigmatism B1 created by the hexapole field generated by the first multipole element 260*a*, a three-fold astigmatism B2 created by the hexapole field generated by the second multipole element 260*b*, a three-fold astigmatism B3 created by the hexapole field generated by the third multipole element 260*c*, and a three-fold astigmatism B4 created by the hexapole field generated by the fourth multipole element 260*d* are illustrated schematically.

In the four-stage hexapole field type spherical aberration corrector, the intensity of the three-fold astigmatism B1 and the intensity of the three-fold astigmatism B2 are equal to each other. The direction of the three-fold astigmatism B2 is a direction obtained by rotating the three-fold astigmatism B1 by 60°. Further, the intensity of the three-fold astigmatism B3 and the intensity of the three-fold astigmatism B4 are equal to each other. The direction of the three-fold astigmatism B4 is a direction obtained by rotating the three-fold astigmatism B3 by 60°.

Further, the direction of the three-fold astigmatism B2 is the same as the direction of the three-fold astigmatism B3. The intensity of the three-fold astigmatism B3 is smaller than the intensity of the three-fold astigmatism B2. For example, the ratio B2:B3 between the intensity of the three-fold astigmatism B2 and the intensity of the three-fold astigmatism B3 is, for example, B2:B3=1: x, where x is $0.4<x<0.8$. The ratio B2:B3 is set according to the focal length of the objective lens, the spherical aberration coefficient of the objective lens, the transfer magnification, the focal length of the transfer optical system, the spherical aberration coefficient of the transfer optical system, the thickness of the multipole element, and the like.

In the aberration corrector 26, by generating the three-fold astigmatism B1, the three-fold astigmatism B2, the three-fold astigmatism B3, and the three-fold astigmatism B4 described above by four stages of multipole elements, it is possible to correct the three-fold astigmatism, the spherical aberration, the six-fold astigmatism, and the sixth-order three-lobe aberration.

The three-fold astigmatism is generated in each of the first multipole element 260*a* and the second multipole element 260*b*. The three-fold astigmatism generated by the first multipole element 260*a* cancels out the three-fold astigmatism generated by the second multipole element 260*b*. The three-fold astigmatism is generated in each of the third multipole element 260*c* and the fourth multipole element 260*d*. The three-fold astigmatism generated by the third multipole element 260*c* cancels out the three-fold astigmatism generated by the fourth multipole element 260*d*. Therefore, in the aberration corrector 26, it is possible to correct the three-fold astigmatism.

The first multipole element 260*a* generates a negative spherical aberration. Similarly, the second multipole element 260*b*, the third multipole element 260*c*, and the fourth multipole element 260*d* each generate a negative spherical aberration. A positive spherical aberration of the irradiation optical system 20 can be canceled out by the negative spherical aberrations generated by these four stages of multipole elements. As a result, in the aberration corrector 26, it is possible to correct the spherical aberration of the irradiation optical system 20.

In the aberration corrector 26, it is possible to correct the six-fold astigmatism by balancing a six-fold astigmatism generated by each of the first multipole element 260*a*, the second multipole element 260*b*, the third multipole element 260*c*, and the fourth multipole element 260*d* and a six-fold astigmatism generated due to a combination aberration of the spherical aberration caused in the transfer optical system and an aberration caused by the hexapole field generated by the multipole element.

In the aberration corrector 26, the sixth-order three-lobe aberration generated by the first multipole element 260*a* and the second multipole element 260*b* and the sixth-order three-lobe aberration generated by the third multipole element 260*c* and the fourth multipole element 260*d* cancel out each other. As a result, in the aberration corrector 26, it is possible to correct the sixth-order three-lobe aberration.

3.2. Operation

3.2.1. Operation Mode

In the electron microscope according to the third embodiment, the electron optical system 2 has a first mode in which the aberration corrector 26 operates as a four-stage hexapole field type spherical aberration corrector and a second mode in which the aberration corrector 26 operates as a two-stage hexapole field type spherical aberration corrector or a three-stage hexapole field type spherical aberration corrector.

3.2.2. First Mode

In the first mode, the aberration corrector 26 operates as a four-stage hexapole field type spherical aberration corrector. For this reason, a high-order aberration can be corrected, and a high-resolution STEM image can be acquired.

3.2.3. Second Mode

The electron microscope according to the third embodiment has the second mode in which the aberration corrector 26 operates as a two-stage hexapole field type spherical aberration corrector and the second mode in which the aberration corrector 26 operates as a three-stage hexapole field type spherical aberration corrector.

In the second mode in which the aberration corrector 26 operates as a two-stage hexapole field type spherical aberration corrector, aberration is corrected by exciting two adjacent multipole elements, and the parameters other than aberration are adjusted using the transfer optical system that is not disposed between the excited two multipole elements without exciting the remaining two multipole elements.

For example, aberration is corrected by exciting the third multipole element 260*c* and the fourth multipole element 260*d* without exciting the first multipole element 260*a* and the second multipole element 260*b*. Further, the parameters other than aberration are adjusted using the first transfer optical system 262*a* and the second transfer optical system 262*b* that are not disposed between the third multipole element 260*c* and the fourth multipole element 260*d* which are excited.

Further, aberration may be corrected by exciting the first multipole element 260*a* and the second multipole element 260*b* without exciting the third multipole element 260*c* and the fourth multipole element 260*d*, and the parameters other than aberration may be adjusted using the third transfer optical system 262*c* and the fourth transfer optical system 262*d*.

Further, aberration may be corrected by exciting the second multipole element 260*b* and the third multipole element 260*c* without exciting the first multipole element 260*a* and the fourth multipole element 260*d*, and the parameters other than aberration may be adjusted using the first transfer optical system 262*a* and the fourth transfer optical system 262*d*.

Thus, in the second mode in which the aberration corrector 26 operates as a two-stage hexapole field type spherical aberration corrector, aberration can be corrected by exciting two adjacent multipole elements, and the parameters other than aberration can be adjusted using the transfer optical system that is not disposed between the excited two multipole elements. In the second mode in which the aberration corrector 26 having four stages of multipole elements operates as a two-stage hexapole field type spherical aberration corrector, two transfer optical systems can be used to adjust the parameters other than aberration, and thus the degree of freedom in adjusting the electron optical system 2 can be improved.

In a second mode in which the aberration corrector 26 operates as a three-stage hexapole field type spherical aberration corrector, for example, aberration is corrected by exciting the second multipole element 260*b*, the third multipole element 260*c*, and the fourth multipole element 260*d* without exciting the first multipole element 260*a*. At this time, the parameters other than aberration are adjusted using the first transfer optical system 262*a* that is not disposed between the second multipole element 260*b* and the third multipole element 260*c* and between the third multipole element 260*c* and the fourth multipole element 260*d*.

Further, aberration is corrected by exciting the first multipole element 260*a*, the second multipole element 260*b*, and the third multipole element 260*c* without exciting the fourth multipole element 260*d*. At this time, the parameters other than aberration are adjusted using the fourth transfer optical system 262*d* that is not disposed between the first multipole element 260*a* and the second multipole element 260*b* and between the second multipole element 260*b* and the third multipole element 260*c*.

Thus, in the aberration corrector 26 having four stages of multipole elements and four stages of transfer optical systems, aberration is adjusted by exciting at least two of the multipole elements without exciting at least one of the multipole elements. At this time, parameters other than aberration are adjusted using the transfer optical system that is not disposed between the excited multipole elements.

In the electron microscope according to the third embodiment, in the second mode, the aberration corrector 26 can operates as a two-stage hexapole field spherical aberration corrector or the aberration corrector 26 can operate as a three-stage hexapole field type spherical aberration corrector depending on the required resolution and the number of parameters of the electron optical system 2 that need to be adjusted.

3.3. Method of Adjusting Electron Optical System

Figure 14:
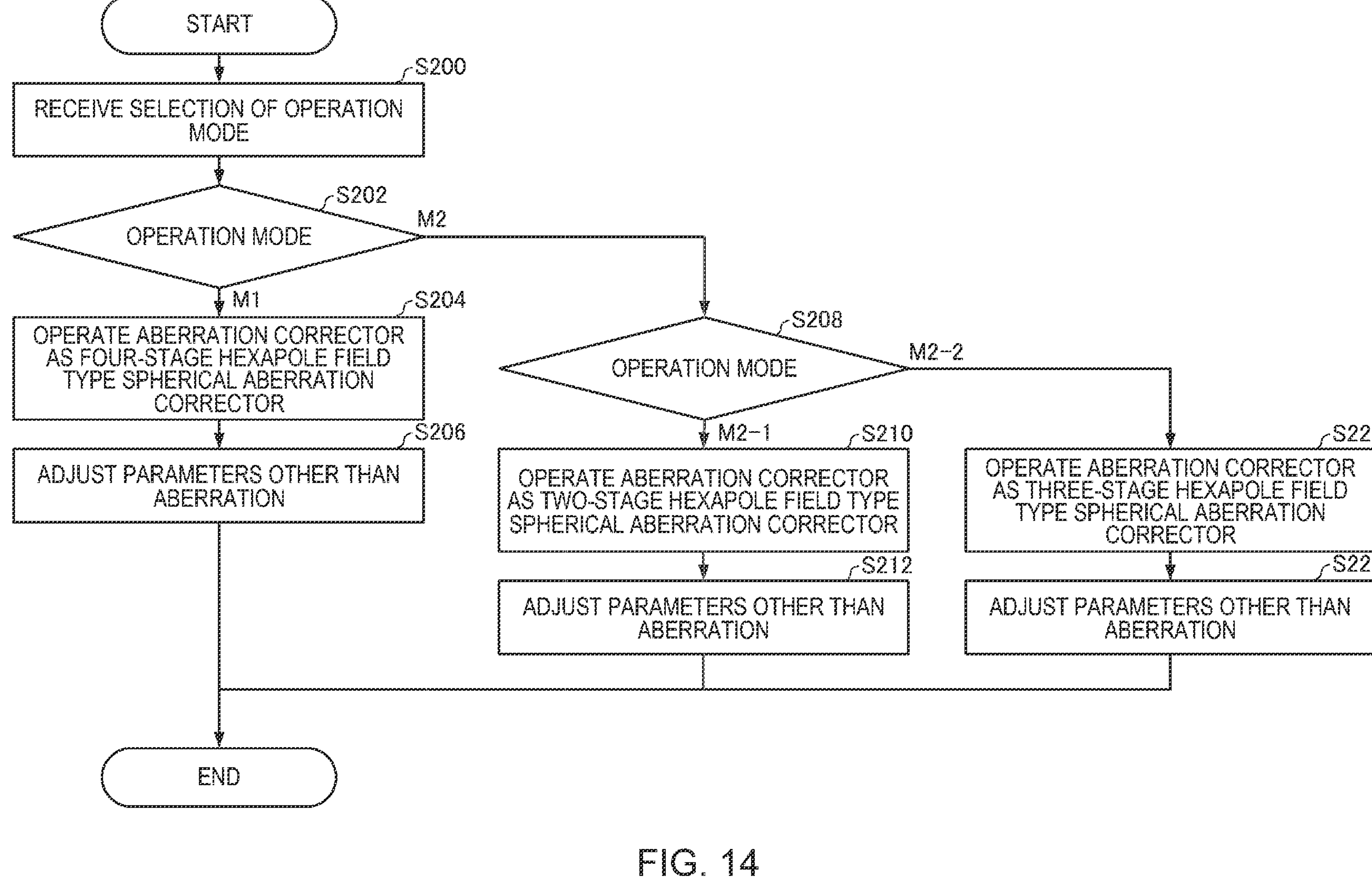
FIG. 14 is a flowchart illustrating an example of adjustment processing for an electron optical system, performed by a control unit.

FIG. 14 is a flowchart illustrating an example of adjustment processing for the electron optical system 2, performed by the control unit 60. Hereinafter, points different from the adjustment processing illustrated in FIG. 6 will be described, and description of the same points will be omitted.

The control unit 60 receives selection of an operation mode (S200).

In a case where the first mode is selected (M1 in S202), the control unit 60 excites the first multipole element 260*a*, the second multipole element 260*b*, the third multipole element 260*c*, and the fourth multipole element 260*d* of the aberration corrector 26 and operates the aberration corrector 26 as a four-stage hexapole field type spherical aberration corrector (S204). As a result, it possible to correct the six-fold astigmatism and the sixth-order three-lobe aberration while the spherical aberration of the irradiation optical system 20 is corrected.

The control unit 60 adjusts the parameters of the electron optical system 2 other than aberration (S206). The control unit 60 adjusts the convergence angle of the electron beam and the focus of the electron beam on the sample plane using the condenser lens 22 and the condenser lens 25.

Through the above processing, it is possible to operate the electron optical system 2 in the first mode.

In a case where the second mode is selected (M2 in S202), the control unit 60 receives selection as to whether to operate the aberration corrector 26 as a two-stage hexapole field type spherical aberration corrector or to operate the aberration corrector 26 as a three-stage hexapole field type spherical aberration corrector (S208).

In a case where the operation by a two-stage hexapole field type spherical aberration corrector is selected (M2-1 in S208), for example, the control unit 60 sets the excitation of the first multipole element 260*a* and the second multipole element 260*b* of the aberration corrector 26 to zero, excites the third multipole element 260*c* and the fourth multipole element 260*d* of the aberration corrector 26, and operates the aberration corrector 26 as a two-stage hexapole field type spherical aberration corrector (S210).

The control unit 60 adjusts the parameters of the electron optical system 2 other than aberration (S212).

The control unit 60 adjusts the convergence angle of the electron beam and the focus of the electron beam on the sample plane using, for example, the condenser lens 22 and the condenser lens 25. Further, the control unit 60 performs focusing the condenser aperture 23 on the reciprocal space and adjusting the position of the crossover using the two electron lenses that make up the first transfer optical system 262*a* of the aberration corrector 26 and the two electron lenses that make up the second transfer optical system 262*b* of the aberration corrector 26.

Through the above processing, in the second mode, the aberration corrector 26 can be operated as a two-stage hexapole field type spherical aberration corrector.

In a case where the operation by a three-stage hexapole field type spherical aberration corrector is selected (M2-2 in S208), for example, the control unit 60 sets the excitation of the first multipole element 260*a* of the aberration corrector 26 to zero, excites the second multipole element 260*b*, the third multipole element 260*c*, and the fourth multipole element 260*d* of the aberration corrector 26, and operates the aberration corrector 26 as a three-stage hexapole field type spherical aberration corrector (S220).

The control unit 60 adjusts the parameters of the electron optical system 2 other than aberration (S222).

The control unit 60 adjusts the convergence angle of the electron beam and the focus of the electron beam on the sample plane using the condenser lens 22 and the condenser lens 25. Further, the control unit 60 performs focusing the condenser aperture 23 on the reciprocal space and adjusting the position of the crossover using the two electron lenses that make up the first transfer optical system 262*a* of the aberration corrector 26.

Through the above processing, in the second mode, the aberration corrector 26 can be operated as a three-stage hexapole field type spherical aberration corrector.

3.4. Effect

In the method of adjusting the electron optical system 2 in the electron microscope according to the third embodiment, that is, in the method of adjusting the electron optical system 2 in the electron microscope provided with the electron optical system 2 that includes the aberration corrector 26 in which the multipole elements and the transfer optical systems are alternately disposed and which has four stages of multipole elements, aberration is adjusted using at least two of the multipole elements without using at least one of the multipole elements, and the parameters of the irradiation optical system 20 other than aberration are adjusted using the transfer optical system that is not disposed between the multipole elements used. Therefore, the degree of freedom in adjusting the electron optical system 2 can be improved without increasing the size of the apparatus.

The electron microscope according to the third embodiment has the first mode in which aberration is adjusted using all of the multipole elements of the aberration corrector 26 and the second mode in which aberration is adjusted using at least two of the multipole elements without using at least one of the multipole elements and the parameters of the irradiation optical system 20 other than aberration are adjusted using the transfer optical system that is not disposed between the multipole elements used. Therefore, a high-resolution STEM image can be acquired using the first mode, and various parameters of the electron optical system 2 can be adjusted using the second mode.

4. Fourth Embodiment

4.1. Electron Microscope

Next, an electron microscope according to the fourth embodiment will be described. The electron microscope according to the fourth embodiment has the same configuration as the electron microscope 200 illustrated in FIGS. 8 and 9 except that the aberration corrector 42 is a four-stage hexapole field type spherical aberration corrector. Hereinafter, points different from the above examples of the electron microscope according to the first embodiment, the electron microscope according to the second embodiment, and the electron microscope according to the third embodiment will be described, and description of the same points will be omitted.

Figure 15:
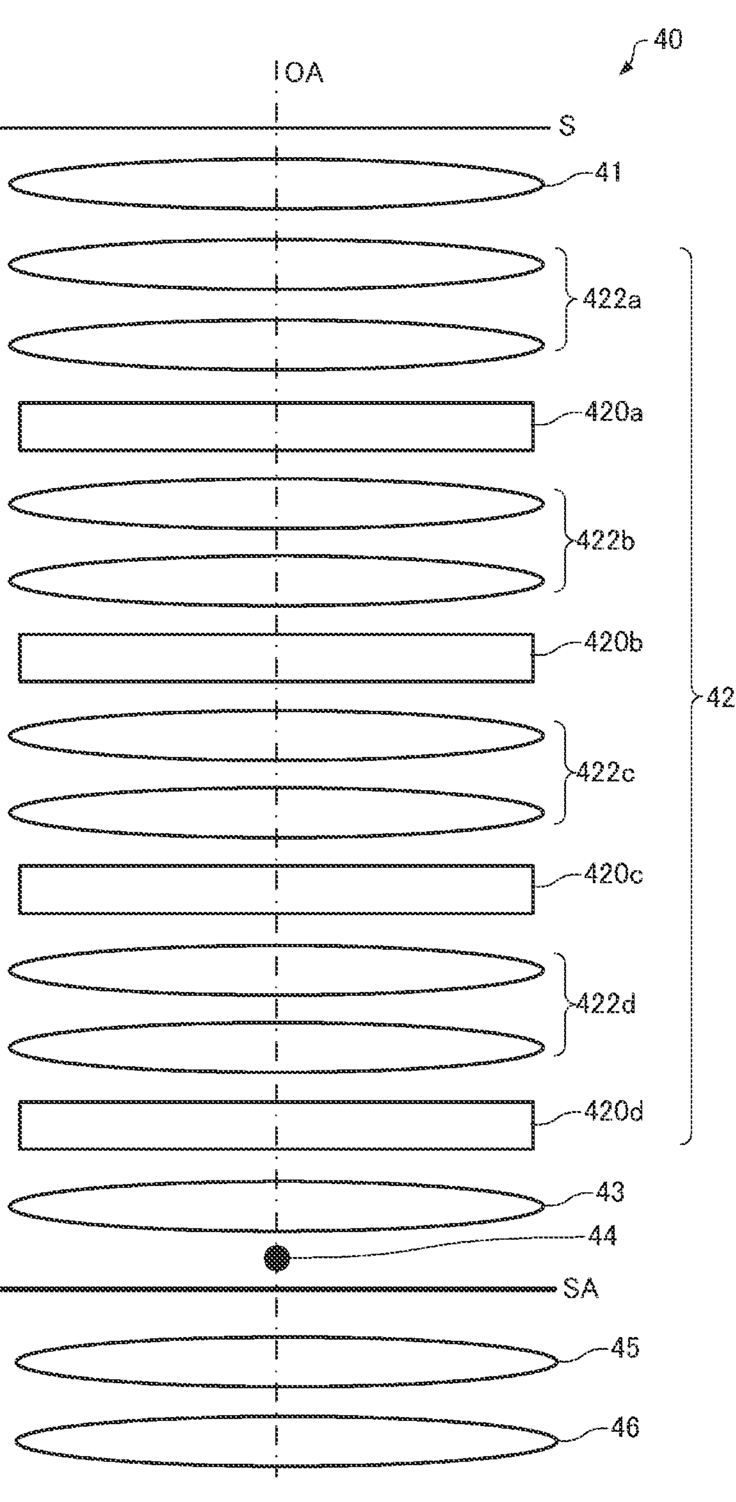
FIG. 15 is a diagram illustrating a configuration of an aberration corrector of an electron microscope according to the fourth embodiment.

FIG. 15 is a diagram illustrating a configuration of an aberration corrector 42 of the electron microscope according to the fourth embodiment.

As illustrated in FIG. 15, the aberration corrector 42 includes a first multipole element 420*a*, a second multipole element 420*b*, a third multipole element 420*c*, a fourth multipole element 420*d*, a first transfer optical system 422*a*, a second transfer optical system 422*b*, a third transfer optical system 422*c*, and a fourth transfer optical system 422*d*. The aberration corrector 42 is a four-stage hexapole field type spherical aberration corrector in which multipole elements and transfer optical systems are alternately disposed and which has four stages of multipole elements and four stages of transfer optical systems.

The arrangement of the four stages of multipole elements constituting the aberration corrector 42 illustrated in FIG. 15 and the arrangement of the four stages of multipole elements of the aberration corrector 26 illustrated in FIG. 12 are symmetrical with respect to the objective lens. In the aberration corrector 42, it is possible to correct three-fold astigmatism, spherical aberration, six-fold astigmatism, and sixth-order three-lobe aberration on the same principle as the aberration corrector 26.

4.2. Operation

4.2.1. Operation Mode

In the electron microscope according to the fourth embodiment, the electron optical system 2 has a first mode in which the aberration corrector 42 operates as a four-stage hexapole field type spherical aberration corrector and a second mode in which the aberration corrector 42 operates as a two-stage hexapole field type spherical aberration corrector or a three-stage hexapole field type spherical aberration corrector.

4.2.2. First Mode

In the first mode, the aberration corrector 42 operates as a four-stage hexapole field type spherical aberration corrector. For this reason, a high-order aberration can be corrected, and a high-resolution TEM image can be acquired.

4.2.3. Second Mode

Similarly to the electron microscope according to the third embodiment described above, the electron microscope according to the fourth embodiment has the second mode in which the aberration corrector 42 operates as a two-stage hexapole field type spherical aberration corrector and the second mode in which the aberration corrector 42 operates as a three-stage hexapole field type spherical aberration corrector. In the second mode, adjusting the magnification of the selected-area aperture plane SA, adjusting the crossover position on the upstream side of the biprism 44, and adjusting the magnification of the image plane on the downstream side of the biprism 44 are performed using the magnification adjustment lens 43 and the two electron lenses that make up the transfer optical system that is not disposed between the excited multipole elements.

4.3. Method of Adjusting Electron Optical System

The adjustment processing of the control unit 60 in the electron microscope according to the fourth embodiment is the same as the adjustment processing of the control unit 60 in the electron microscope according to the third embodiment illustrated in FIG. 14 described above except that the adjustment processing of the parameters other than aberration is different, and a description thereof is omitted.

4.4. Effect

In the method of adjusting the electron optical system 2 in the electron microscope according to the fourth embodiment, that is, in the method of adjusting the electron optical system 2 in the electron microscope provided with the electron optical system 2 that includes the aberration corrector 42 in which the multipole elements and the transfer optical systems are alternately disposed and which has four stages of multipole elements, aberration is corrected using at least two of the multipole elements without using at least one of the multipole elements, and the parameters of the imaging optical system 40 other than aberration are adjusted using the transfer optical system that is not disposed between the multipole elements used. Therefore, the degree of freedom in adjusting the electron optical system 2 can be improved without increasing the size of the apparatus.

The electron microscope according to the fourth embodiment has the first mode in which aberration is adjusted using all of the multipole elements of the aberration corrector 42 and the second mode in which aberration is adjusted using at least two of the multipole elements without using at least one of the multipole elements and the parameters of the imaging optical system 40 other than aberration are adjusted using the transfer optical system that is not disposed between the multipole elements used. Therefore, a high-resolution TEM image can be acquired using the first mode, and various parameters of the electron optical system 2 can be adjusted using the second mode. Further, in the electron microscope according to the fourth embodiment, the degree of freedom in adjusting the electron optical system 2 can be improved without increasing the size of the apparatus.

4.5. Modification Example

In the electron microscope according to the third embodiment, the aberration corrector 26 is incorporated in the irradiation optical system 20, and in the electron microscope according to the fourth embodiment, the aberration corrector 42 is incorporated in the imaging optical system 40, but it is also possible that the aberration corrector 26 is incorporated in the irradiation optical system 20 and the aberration corrector 42 is incorporated in the imaging optical system 40.

5. Modification Example

In the first to fourth embodiments described above, the case in which the charged particle beam apparatus according to the present invention is an electron microscope provided with the electron optical system 2 for controlling the electron beam has been described, but the charged particle beam apparatus according to the present invention only has to be a charged particle beam apparatus provided with the charged particle optical system for controlling the charged particle beam. Examples of the charged particle beam other than the electron beam include an ion beam.

Further, in the first to fourth embodiments described above, the case where the multipole element generates a magnetic hexapole field has been described, but the multipole element may generate an electric hexapole field, or may generate a superimposed field of the magnetic hexapole field and the electric hexapole field.

The above-described embodiments and modification example are merely examples, and the present invention is not limited thereto. For example, each embodiment and the modification example can be combined as appropriate.

The invention is not limited to the above-described embodiments, and various modifications can be made. For example, the invention includes configurations that are substantially the same as the configurations described in the embodiments. Substantially same configurations mean configurations having the same functions, methods and results, or configurations having the same objectives and effects as those of the configurations described in the embodiments, for example. The invention also includes configurations obtained by replacing non-essential elements of the configurations described in the embodiments with other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

What is claimed is:

1. A method of adjusting a charged particle optical system in a charged particle beam apparatus provided with the charged particle optical system comprising an aberration corrector in which multipole elements disposed in three or more stages and transfer optical systems are alternately disposed, the method comprising:

adjusting aberration using at least two of the multipole elements without using at least one of the multipole elements; and adjusting parameters of the charged particle optical system other than aberration using at least one of the transfer optical systems that is not disposed between the at least two of the multipole elements used.

2. The method of adjusting a charged particle optical system according to claim 1, wherein the charged particle optical system comprises an irradiation optical system for irradiating a sample with a charged particle beam, the irradiation optical system comprises the aberration corrector, in the aberration corrector, the multipole elements are disposed in three stages, and the transfer optical systems are disposed in three stages, aberration is adjusted using one of the multipole elements in a second stage and one of the multipole elements in a third stage without using one of the multipole elements in a first stage, and the parameters of the charged particle optical system other than aberration are adjusted using one of the transfer optical systems in a first stage.

3. The method of adjusting a charged particle optical system according to claim 2, wherein at least one of adjusting a convergence angle of the charged particle beam, focusing a condenser aperture on a reciprocal space, and adjusting a position of crossover is performed using the one of the transfer optical systems in the first stage.

4. The method of adjusting a charged particle optical system according to claim 1, wherein the charged particle optical system comprises an irradiation optical system for irradiating a sample with a charged particle beam, the irradiation optical system comprises the aberration corrector, in the aberration corrector, the multipole elements are disposed in three stages, and the transfer optical systems are disposed in three stages, aberration is adjusted using one of the multipole elements in a first stage and one of the multipole elements in a second stage without using one of the multipole elements in a third stage, and the parameters of the charged particle optical system other than aberration are adjusted using one of the transfer optical systems in a third stage.

5. The method of adjusting a charged particle optical system according to claim 1, wherein the charged particle optical system comprises an imaging optical system for forming an image of charged particles that have been transmitted through a sample, the imaging optical system comprises the aberration corrector, in the aberration corrector, the multipole elements are disposed in three stages, and the transfer optical systems are disposed in three stages, aberration is adjusted using one of the multipole elements in a second stage and one of the multipole elements in a third stage without using one of the multipole elements in a first stage, and the parameters of the charged particle optical system other than aberration are adjusted using one of the transfer optical systems in a first stage.

6. The method of adjusting a charged particle optical system according to claim 1, wherein the charged particle optical system comprises an imaging optical system for forming an image of charged particles that have been transmitted through a sample, the imaging optical system comprises the aberration corrector, in the aberration corrector, the multipole elements are disposed in three stages, and the transfer optical systems are disposed in three stages, aberration is adjusted using one of the multipole elements in a first stage and one of the multipole elements in a second stage without using one of the multipole elements in a third stage, and the parameters of the charged particle optical system other than aberration are adjusted using one of the transfer optical systems in a third stage.

7. A charged particle beam apparatus comprising:

a charged particle optical system comprising an aberration corrector in which multipole elements disposed in three or more stages and transfer optical systems are alternately disposed and a processor operatively connected to the charged particle optical system, the processor configured to operate the charged particle optical system in a first mode in which aberration is adjusted using all of the multipole elements of the aberration corrector, and a second mode in which aberration is adjusted using at least two of the multipole elements without using at least one of the multipole elements, and parameters of the charged particle optical system other than aberration are adjusted using at least one of the transfer optical systems that is not disposed between the at least two of the multipole elements used.

8. The charged particle beam apparatus according to claim 7, wherein the charged particle optical system comprises an irradiation optical system for irradiating a sample with a charged particle beam, the irradiation optical system comprises the aberration corrector, in the aberration corrector, the multipole elements are disposed in three stages, and the transfer optical systems are disposed in three stages, and in the second mode, aberration is adjusted using one of the multipole elements in a second stage and one of the multipole elements in a third stage without using one of the multipole elements in a first stage, and the parameters of the charged particle optical system other than aberration are adjusted using one of the transfer optical systems in a first stage.

9. The charged particle beam apparatus according to claim 7, wherein the charged particle optical system comprises an irradiation optical system for irradiating a sample with a charged particle beam, the irradiation optical system comprises the aberration corrector, in the aberration corrector, the multipole elements are disposed in three stages, and the transfer optical systems are disposed in three stages, and in the second mode, aberration is adjusted using one of the multipole elements in a first stage and one of the multipole elements in a second stage without using one of the multipole elements in a third stage, and the parameters of the charged particle optical system other than aberration are adjusted using one of the transfer optical systems in a third stage.

10. The charged particle beam apparatus according to claim 7, wherein the charged particle optical system comprises an imaging optical system for forming an image of charged particles that have been transmitted through a sample, the imaging optical system comprises the aberration corrector, in the aberration corrector, the multipole elements are disposed in three stages, and the transfer optical systems are disposed in three stages, and in the second mode, aberration is adjusted using one of the multipole elements in a second stage and one of the multipole elements in a third stage without using one of the multipole elements in a first stage, and the parameters of the charged particle optical system other than aberration are adjusted using one of the transfer optical systems in a first stage.

11. The charged particle beam apparatus according to claim 7, wherein the charged particle optical system comprises an imaging optical system for forming an image of charged particles that have been transmitted through a sample, the imaging optical system comprises the aberration corrector, in the aberration corrector, the multipole elements are disposed in three stages, and the transfer optical systems are disposed in three stages, and in the second mode, aberration is adjusted using one of the multipole elements in a first stage and one of the multipole elements in a second stage without using one of the multipole elements in a third stage, and the parameters of the charged particle optical system other than aberration are adjusted using one of the transfer optical systems in a third stage.

* * * * *